(12) United States Patent
Ishida et al.

(10) Patent No.: US 7,366,269 B2
(45) Date of Patent: Apr. 29, 2008

(54) FALSE LOCK DETECTION CIRCUIT AND FALSE LOCK DETECTION METHOD, PLL CIRCUIT AND CLOCK DATA RECOVERY METHOD, COMMUNICATION DEVICE AND COMMUNICATION METHOD, AND OPTICAL DISK REPRODUCING DEVICE AND OPTICAL DISK REPRODUCING METHOD

(75) Inventors: Hiroki Ishida, Kanagawa (JP); Takashi Nishimura, Kanagawa (JP)

(73) Assignee: Sony Corporation (JP)

( * ) Notice: Subject to any disclaimer, the term of this patent is extended or adjusted under 35 U.S.C. 154(b) by 588 days.

(21) Appl. No.: 11/108,741

(22) Filed: Apr. 19, 2005

(65) Prior Publication Data

US 2005/0238129 A1    Oct. 27, 2005

(30) Foreign Application Priority Data

Apr. 26, 2004   (JP)   ............................. 2004-130320

(51) Int. Cl.
*H04L 7/00* (2006.01)

(52) U.S. Cl. ........................................ 375/368; 375/376

(58) Field of Classification Search ................. 375/368, 375/373, 375–376
See application file for complete search history.

(56) References Cited

U.S. PATENT DOCUMENTS 5,123,030 A * 6/1992 Kazawa et al. ............. 375/294
5,255,292 A * 10/1993 LaRosa et al. .............. 375/368
6,807,225 B1 * 10/2004 Tonietto et al. ............. 375/219

FOREIGN PATENT DOCUMENTS

JP             04-132048            5/1992

* cited by examiner

*Primary Examiner*—Khanh C. Tran
(74) *Attorney, Agent, or Firm*—Rader Fishman & Grauer PLLC; Ronald P. Kananen

(57) ABSTRACT

Disclosed herein is a false lock detection circuit including: a data signal input section receiving an input of a data signal; a clock signal input section receiving an input of a clock signal generated from the data signal; a pattern detector obtaining the data signal on a basis of the clock signal, and detecting a data pattern in which adjacent pieces of data at at least three consecutive bits differ from each other; a phase period shift detector detecting a shift between periods of phases at a change point of the data signal and a change point of the clock signal; and a determining section determining whether a false lock has occurred on a basis of results of detection of the pattern detector and the phase period shift detector.

17 Claims, 15 Drawing Sheets

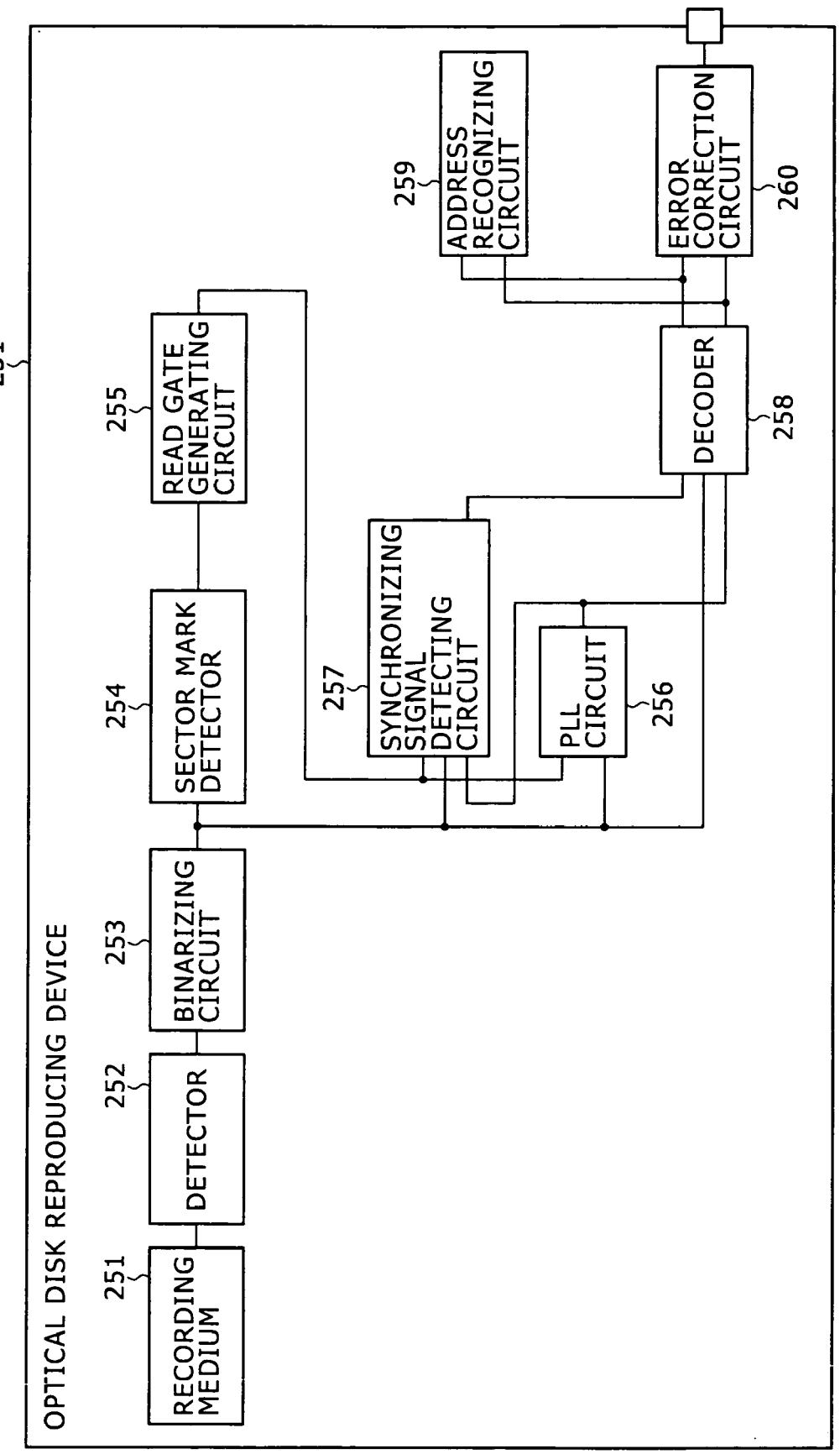

FALSE LOCK DETECTION CIRCUIT AND FALSE LOCK DETECTION METHOD, PLL CIRCUIT AND CLOCK DATA RECOVERY METHOD, COMMUNICATION DEVICE AND COMMUNICATION METHOD, AND OPTICAL DISK REPRODUCING DEVICE AND OPTICAL DISK REPRODUCING METHOD

CROSS REFERENCE TO RELATED APPLICATION

The present invention contains subject matter related to Japanese Patent Application JP 2004-130320 filed in the Japanese Patent Office on Apr. 26, 2004, the entire contents of which being incorporated herein by reference.

BACKGROUND OF THE INVENTION

The present invention relates to a false lock detection circuit and a false lock detection method, a PLL circuit and a clock data recovery method, a communication device and a communication method, and an optical disk reproducing device and an optical disk reproducing method, and particularly to a false lock detection circuit and a false lock detection method, a PLL circuit and a clock data recovery method, a communication device and a communication method, and an optical disk reproducing device and an optical disk reproducing method that can detect a false lock accurately when the false lock occurs regardless of whether a ratio of data rate to clock frequency is 1:n (n is a positive integer other than one) or m:n (m is a positive integer other than one).

In the past, for example, a communication device or the like without a signal used exclusively for a clock uses a clock data recovery circuit using a PLL (Phase Locked Loop) circuit.

A clock data recovery circuit using a PLL circuit generally uses a VCO (Voltage Controlled Oscillator). By pulling in a pattern in a fixed period included in a received signal, a clock synchronous with the pattern can be generated. The VCO can lock data within a frequency variable range.

However, due to various factors, the PLL circuit may operate erroneously to lock clock frequency to a frequency different from a data rate, that is, the PLL circuit may stabilize at a frequency different from the data rate. Thus locking the clock frequency to a frequency different from the data rate is referred to as a false lock or a harmonic lock.

When a reproduced clock is normally locked to data, the data and the clock have a phase relation as shown in FIG. 1. Specifically, a rising edge of the reproduced clock is positioned at a center of each data bit, and each data bit is captured at the rising edge, whereby the data can be extracted again. On the other hand, when the reproduced clock is locked to a clock frequency where a ratio of a data rate to the clock frequency is 1:2, the data and the clock have a phase relation as shown in FIG. 2. When the reproduced clock is locked to a clock frequency where the ratio of the data rate to the clock frequency is 3:4, the data and the clock have a phase relation as shown in FIG. 3. However, when the reproduced clock is locked to the clock frequency where the ratio of the data rate to the clock frequency is 1:2, or when the reproduced clock is locked to the clock frequency where the ratio of the data rate to the clock frequency is 3:4, that is, when a false lock has occurred, a general phase comparator cannot go out of such phase relations, thus resulting in erroneous operation.

When a false lock has occurred, the clock data recovery circuit needs to be restarted to perform a new pull-in operation so that a reproduced clock is locked to data at a correct frequency.

Accordingly, a CRC (Cyclic Redundancy Check or Cyclic Redundancy Code) included in data to detect errors is used in the past. When a CRC error occurs, the clock data recovery circuit is restarted assuming that there is a possibility of occurrence of a false lock in the PLL circuit. Once locked normally, the PLL circuit hardly goes thereafter into a false lock state or an unstable state. It is therefore better to avoid restarting the PLL circuit locked normally if possible. When a CRC error occurs, however, whether the CRC error is caused by abnormal operation of the PLL or whether the CRC error is caused by a defect in the signal while the PLL is operating correctly cannot be determined.

On the other hand, there is a technique that can detect that a PLL is not normally locked when an (n+1)T or (n−1)T pattern is detected in patterns of a fixed period nT included in an input signal, for example, as shown in Japanese Patent Laid-Open No. Hei 4-132048.

When the PLL is normally locked, and data captured by the synchronous clock is random data, a probability of occurrence of data (1, 0, 1) or data (0, 1, 0) is 25%. On the other hand, as shown in FIG. 2, when a false lock has occurred at a clock frequency where a ratio of a data rate to the clock frequency is 1:n, the probability of occurrence of the data (1, 0, 1) or the data (0, 1, 0) in the data captured by the synchronous clock is 0%. Hence, on the basis of the probability of occurrence of the data (1, 0, 1) or the data (0, 1, 0), occurrence of a false lock at a clock frequency where the ratio of the data rate to the clock frequency is 1:n (n is a positive integer other than one) can be detected.

SUMMARY OF THE INVENTION

However, in order to detect that the PLL is not normally locked when the (n+1)T or (n−1)T pattern is detected in the patterns of the fixed period nT included in an input signal, a predetermined clock signal represented by nT needs to be included in the input signal.

In addition, when the probability of occurrence of the data (1, 0, 1) or the data (0, 1, 0) is obtained, it is possible to detect occurrence of a false lock at a clock frequency where the ratio of the data rate to the clock frequency is 1:n (n is a positive integer other than one), but it is not possible to detect occurrence of a false lock at a clock frequency where the ratio of the data rate to the clock frequency is m:n (m is a positive integer other than one). For example, as shown in FIG. 3, when a false lock occurs at a clock frequency where the ratio of the data rate to the clock frequency is m:n, the probability of occurrence of the data (1, 0, 1) or the data (0, 1, 0) assumes a value of 0% to 25% depending on values of m and n, and thus it is difficult to set a threshold value for determination.

The present invention has been made in view of the above, and it is desirable to detect a false lock accurately regardless of whether the ratio of the data rate to the clock frequency is 1:n or m:n when an input signal does not include a clock signal.

According to an embodiment of the present invention, there is provided a false lock detection circuit including: data signal input means for receiving an input of a data signal; clock signal input means for receiving an input of a clock signal generated from the data signal; pattern detecting means for obtaining the data signal on a basis of the clock signal, and detecting a data pattern in which adjacent pieces of data at at least three consecutive bits differ from each other; phase period shift detecting means for detecting a shift between periods of phases at a change point of the data signal and a change point of the clock signal; and determining means for determining whether a false lock has occurred on a basis of results of detection of the pattern detecting means and the phase period shift detecting means.

The false lock detection circuit may determine whether to perform an operation of detecting the false lock on a basis of a signal for controlling enabling and disabling of the operation of detecting the false lock.

The phase period shift detecting means may obtain the clock signal at one of a rising edge and a falling edge of the data signal, and detect the shift between the periods of the phases at the change point of the data signal and the change point of the clock signal on a basis of a state of the obtained clock signal.

The phase period shift detecting means may delay the clock signal by a predetermined time, and then obtain the delayed clock signal at one of a rising edge and a falling edge of the data signal.

The phase period shift detecting means may count a number of times that level of the clock signal obtained at one of a rising edge and a falling edge of the data signal is inverted, and detect the shift between the periods of the phases at the change point of the data signal and the change point of the clock signal by comparing a result of counting with a predetermined threshold value.

The pattern detecting means may obtain a probability of occurrence of the data pattern; and the determining means may determine that the false lock has occurred in at least one of cases where the probability of occurrence of the data pattern, the probability being obtained by the pattern detecting means, is a predetermined threshold value or lower and where the phase period shift detecting means detects the shift between the periods of the phases.

According to an embodiment of the present invention, there is provided a false lock detection method including: a pattern detecting step of obtaining a data signal on a basis of a clock signal, and detecting a data pattern in which adjacent pieces of data at at least three consecutive bits differ from each other; a phase period shift detecting step of detecting a shift between periods of phases at a change point of the data signal and a change point of the clock signal; and an output step of outputting a signal indicating whether a false lock has occurred on a basis of a result of detection of the data pattern by a process of the pattern detecting step and a result of detection of the shift between the periods of the phases by a process of the phase period shift detecting step.

The false lock detection circuit and the false lock detection method according to the embodiments of the present invention may obtain a data signal on a basis of a clock signal, detect a data pattern in which adjacent pieces of data at at least three consecutive bits differ from each other, detect a shift between periods of phases at a change point of the data signal and a change point of the clock signal, and detect whether a false lock has occurred on a basis of a result of detection of the data pattern and a result of detection of the shift between the periods of the phases.

According to an embodiment of the present invention, there is provided a PLL circuit including: first determining means for determining whether frequency of a generated clock signal is locked to a predetermined frequency based on a reference clock; second determining means for determining whether a phase of the generated clock signal is correctly locked; third determining means for determining whether the generated clock signal is in a false lock state with respect to a data signal; and control means for controlling a frequency dividing ratio of an output signal from an oscillator on a basis of results of determination of the first determining means, the second determining means, and the third determining means; wherein the third determining means includes data signal input means for receiving an input of the data signal, clock signal input means for receiving an input of the clock signal generated from the data signal, pattern detecting means for obtaining the data signal on a basis of the clock signal, and detecting a data pattern in which adjacent pieces of data at at least three consecutive bits differ from each other, phase period shift detecting means for detecting a shift between periods of phases at a change point of the data signal and a change point of the clock signal, and determining means for determining whether a false lock has occurred on a basis of results of detection of the pattern detecting means and the phase period shift detecting means.

According to an embodiment of the present invention, there is provided a clock data recovery method including: a first determining step of determining whether frequency of a generated clock signal is locked to a predetermined frequency based on a reference clock; a second determining step of determining whether the generated clock signal is in a false lock state with respect to a data signal; a third determining step of determining whether a phase of the generated clock signal is correctly locked; and a control step of controlling a frequency dividing ratio of an output signal from an oscillator on a basis of results of determination by processes of the first determining step, the second determining step, and the third determining step; wherein the process of the second determining step includes a pattern detecting step of obtaining the data signal on a basis of the clock signal, and detecting a data pattern in which adjacent pieces of data at at least three consecutive bits differ from each other, a phase period shift detecting step of detecting a shift between periods of phases at a change point of the data signal and a change point of the clock signal, and an output step of outputting a signal indicating whether a false lock has occurred on a basis of a result of detection of the data pattern by a process of the pattern detecting step and a result of detection of the shift between the periods of the phases by a process of the phase period shift detecting step.

The PLL circuit and the clock data recovery method according to the embodiments of the present invention may determine whether frequency of a generated clock signal is locked to a predetermined frequency based on a reference clock, determine whether a phase of the generated clock signal is correctly locked, determine whether the generated clock signal is in a false lock state with respect to a data signal, and control a frequency dividing ratio of an output signal from an oscillator on a basis of results of these determinations, and in determining a false lock state, receive an input of the data signal, receive an input of the clock signal generated from the data signal, obtain the data signal on a basis of the clock signal, detect a data pattern in which adjacent pieces of data at at least three consecutive bits differ from each other, detect a shift between periods of phases at a change point of the data signal and a change point of the clock signal, and determine whether a false lock has occurred on a basis of results of these detections.

According to an embodiment of the present invention, there is provided a communication device including: receiving means for receiving a data signal; and clock signal generating means for generating a clock signal from the data signal received by the receiving means, using principles of a PLL; wherein the clock signal generating means includes first determining means for determining whether frequency of the generated clock signal is locked to a predetermined frequency based on a reference clock, second determining means for determining whether a phase of the generated clock signal is correctly locked, third determining means for determining whether the generated clock signal is in a false lock state with respect to the data signal, and control means for controlling a frequency dividing ratio of an output signal from an oscillator on a basis of results of determination of the first determining means, the second determining means, and the third determining means, and wherein the third determining means includes data signal input means for receiving an input of the data signal, clock signal input means for receiving an input of the clock signal generated from the data signal, pattern detecting means for obtaining the data signal on a basis of the clock signal, and detecting a data pattern in which adjacent pieces of data at at least three consecutive bits differ from each other, phase period shift detecting means for detecting a shift between periods of phases at a change point of the data signal and a change point of the clock signal, and determining means for determining whether a false lock has occurred on a basis of results of detection of the pattern detecting means and the phase period shift detecting means.

According to an embodiment of the present invention, there is provided a communication method including: a first determining step of determining whether frequency of a generated clock signal is locked to a predetermined frequency based on a reference clock; a second determining step of determining whether the generated clock signal is in a false lock state with respect to a data signal; a third determining step of determining whether a phase of the generated clock signal is correctly locked; and a control step of controlling a frequency dividing ratio of an output signal from an oscillator on a basis of results of determination by processes of the first determining step, the second determining step, and the third determining step; wherein the process of the second determining step includes a pattern detecting step of obtaining the data signal on a basis of the clock signal, and detecting a data pattern in which adjacent pieces of data at at least three consecutive bits differ from each other, a phase period shift detecting step of detecting a shift between periods of phases at a change point of the data signal and a change point of the clock signal, and an output step of outputting a signal indicating whether a false lock has occurred on a basis of a result of detection of the data pattern by a process of the pattern detecting step and a result of detection of the shift between the periods of the phases by a process of the phase period shift detecting step.

The communication device and the communication method according to the embodiments of the present invention receive a data signal, and generate a clock signal from the received data signal, using principles of a PLL, and in generating the clock signal, determine whether frequency of the generated clock signal is locked to a predetermined frequency based on a reference clock, determine whether a phase of the generated clock signal is correctly locked, determine whether the generated clock signal is in a false lock state with respect to the data signal, and control a frequency dividing ratio of an output signal from an oscillator on a basis of results of these determinations, and in determining a false lock state, receive an input of the data signal, receive an input of the clock signal, obtain the data signal on a basis of the clock signal, detect a data pattern in which adjacent pieces of data at at least three consecutive bits differ from each other, detect a shift between periods of phases at a change point of the data signal and a change point of the clock signal, and determine whether a false lock has occurred on a basis of results of these detections.

According to an embodiment of the present invention, there is provided an optical disk reproducing device including: detecting means for detecting a data signal recorded on an optical disk; and clock signal generating means for generating a clock signal from the data signal detected by the detecting means, using principles of a PLL; wherein the clock signal generating means includes first determining means for determining whether frequency of the generated clock signal is locked to a predetermined frequency based on a reference clock, second determining means for determining whether a phase of the generated clock signal is correctly locked, third determining means for determining whether the generated clock signal is in a false lock state with respect to the data signal, and control means for controlling a frequency dividing ratio of an output signal from an oscillator on a basis of results of determination of the first determining means, the second determining means, and the third determining means, and wherein the third determining means includes data signal input means for receiving an input of the data signal, clock signal input means for receiving an input of the clock signal generated from the data signal, pattern detecting means for obtaining the data signal on a basis of the clock signal, and detecting a data pattern in which adjacent pieces of data at at least three consecutive bits differ from each other, phase period shift detecting means for detecting a shift between periods of phases at a change point of the data signal and a change point of the clock signal, and determining means for determining whether a false lock has occurred on a basis of results of detection of the pattern detecting means and the phase period shift detecting means.

According to an embodiment of the present invention, there is provided an optical disk reproducing method including: a first determining step of determining whether frequency of a generated clock signal is locked to a predetermined frequency based on a reference clock; a second determining step of determining whether the generated clock signal is in a false lock state with respect to a data signal; a third determining step of determining whether a phase of the generated clock signal is correctly locked; and a control step of controlling a frequency dividing ratio of an output signal from an oscillator on a basis of results of determination by processes of the first determining step, the second determining step, and the third determining step; wherein the process of the second determining step includes a pattern detecting step of obtaining the data signal on a basis of the clock signal, and detecting a data pattern in which adjacent pieces of data at at least three consecutive bits differ from each other, a phase period shift detecting step of detecting a shift between periods of phases at a change point of the data signal and a change point of the clock signal, and an output step of outputting a signal indicating whether a false lock has occurred on a basis of a result of detection of the data pattern by a process of the pattern detecting step and a result of detection of the shift between the periods of the phases by a process of the phase period shift detecting step.

The optical disk reproducing device and the optical disk reproducing method according to the embodiments of the present invention detect a data signal recorded on an optical disk, and generate a clock signal from the data signal, using principles of a PLL, and in generating the clock signal, determine whether frequency of the generated clock signal is locked to a predetermined frequency based on a reference clock, determine whether a phase of the generated clock signal is correctly locked, determine whether the generated clock signal is in a false lock state with respect to the data signal, and control a frequency dividing ratio of an output signal from an oscillator on a basis of results of these determinations, and in determining a false lock state, receive an input of the data signal, receive an input of the clock signal generated from the data signal, obtain the data signal on a basis of the clock signal, detect a data pattern in which adjacent pieces of data at at least three consecutive bits differ from each other, detect a shift between periods of phases at a change point of the data signal and a change point of the clock signal, and determine whether a false lock has occurred on a basis of results of these detections.

With these configurations, a false lock may be detected, and in particular, a data signal is obtained on a basis of a clock signal, a data pattern in which adjacent pieces of data at at least three consecutive bits differ from each other is detected, and a shift between periods of phases at a change point of the data signal and a change point of the clock signal is detected. It is therefore possible to recognize a false lock state regardless of whether m=1 or not where the ratio of the data rate to the clock frequency is m:n in the false lock state.

Further, a clock signal may be generated from a data signal, and in particular, the data signal is obtained on a basis of the clock signal, a data pattern in which adjacent pieces of data at at least three consecutive bits differ from each other is detected, and a shift between periods of phases at a change point of the data signal and a change point of the clock signal is detected. It is therefore possible to recognize a false lock state regardless of whether m=1 or not where the ratio of the data rate to the clock frequency is m:n in the false lock state, and thus generate the clock signal accurately locked to the data signal.

Further, a data signal can be received, and in particular, the data signal is obtained on a basis of a clock signal, a data pattern in which adjacent pieces of data at at least three consecutive bits differ from each other is detected, and a shift between periods of phases at a change point of the data signal and a change point of the clock signal is detected. It is therefore possible to recognize a false lock state regardless of whether m=1 or not where the ratio of the data rate to the clock frequency is m:n in the false lock state, and thus generate the clock signal accurately locked to the received data signal.

Further, a data signal recorded on an optical disk may be reproduced, and in particular, the data signal is obtained on a basis of a clock signal, a data pattern in which adjacent pieces of data at at least three consecutive bits differ from each other is detected, and a shift between periods of phases at a change point of the data signal and a change point of the clock signal is detected. It is therefore possible to recognize a false lock state regardless of whether m=1 or not where the ratio of the data rate to the clock frequency is m:n in the false lock state, and thus generate the clock signal accurately locked to the data signal read from the optical disk.

BRIEF DESCRIPTION OF THE DRAWINGS

FIG. 17 is a block diagram showing a configuration of an optical disk reproducing device to which the present invention is applied.

DETAILED DESCRIPTION OF PREFERRED EMBODIMENTS

Figure 1:
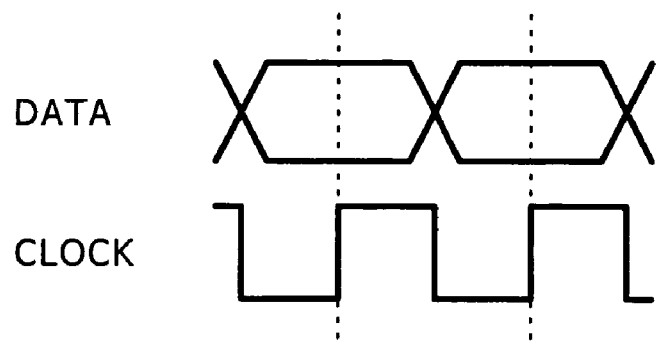
FIG. 1 is a diagram of assistance in explaining a state in which data and a clock are correctly locked to each other.

Preferred embodiments of the present invention will hereinafter be described. Correspondences between inventions described in the present specification and embodiments of the inventions are illustrated as follows. This description is to confirm that embodiments supporting the inventions described in the present specification are described in the present specification. Therefore, even when there is an embodiment described in the embodiments of the inventions but not described here as corresponding to an invention, it does not signify that the embodiment does not correspond to that invention. Conversely, even when an embodiment is described here as corresponding to an invention, it does not signify that the embodiment does not correspond to inventions other than that invention.

Further, this description does not represent all the inventions described in the present specification. In other words, this description does not negate presence of inventions described in the present specification but not claimed in the present application, that is, presence of inventions for divisional application or to be presented or added by amendments in the future.

A false lock detection circuit according to an embodiment of the present invention (for example a false lock detecting unit 63 in FIG. 6) includes: data signal input means (for example a data signal input part 91 in FIG. 6) for receiving an input of a data signal; clock signal input means (for example a clock signal input part 92 in FIG. 6) for receiving an input of a clock signal (for example an output of an N frequency divider 70 in FIG. 5) generated from the data signal; pattern detecting means (for example a pattern detecting unit 101 in FIG. 6) for obtaining the data signal on a basis of the clock signal, and detecting a data pattern in which adjacent pieces of data at at least three consecutive bits differ from each other (for example 101 or 010); phase period shift detecting means (for example a period shift detecting unit 102 in FIG. 6) for detecting a shift between periods of phases at a change point of the data signal and a change point of the clock signal; and determining means (for example a determining unit 103 in FIG. 6) for determining whether a false lock has occurred on a basis of results of detection of the pattern detecting means and the phase period shift detecting means.

Figure 6:
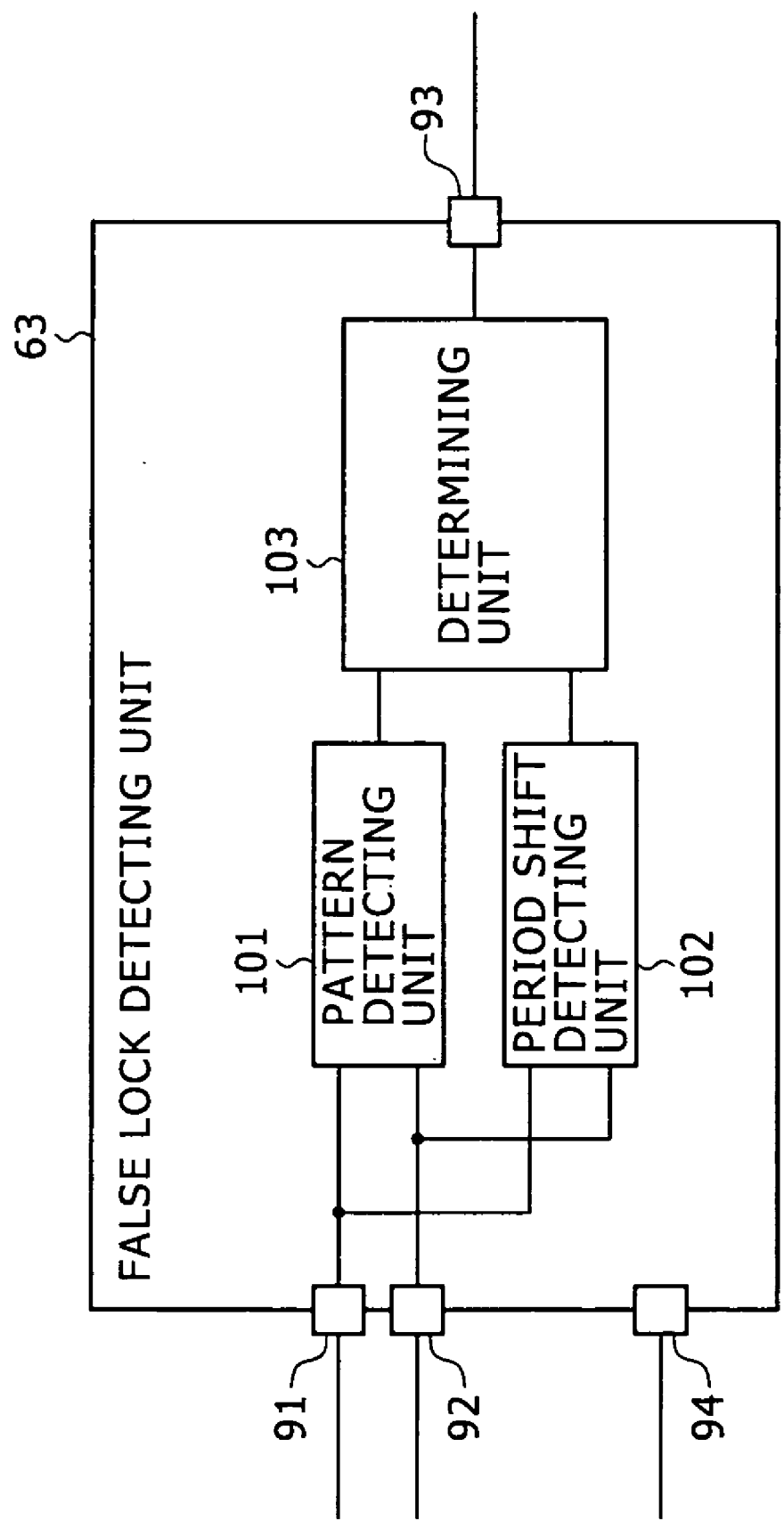
FIG. 6 is a block diagram showing a configuration of a false lock detecting unit in FIG. 5.

The false lock detection circuit can determine whether to perform an operation of detecting the false lock on a basis of a signal for controlling enabling and disabling of the operation of detecting the false lock (for example an enable signal input from a detection enable signal input part 94 in FIG. 6).

A false lock detection method according to an embodiment of the present invention for a false lock detection circuit for receiving inputs of a data signal and a clock signal (for example an output of an N frequency divider 70 in FIG. 5) generated from the data signal, and detecting a false lock includes: a pattern detecting step (for example a process of step S32 in FIG. 16) of obtaining the data signal on a basis of the clock signal, and detecting a data pattern in which adjacent pieces of data at at least three consecutive bits differ from each other (for example 101 or 010); a phase period shift detecting step (for example a process of step S33 in FIG. 16) of detecting a shift between periods of phases at a change point of the data signal and a change point of the clock signal; and an output step (for example a process of step S36 or step S37 in FIG. 16) of outputting a signal indicating whether a false lock has occurred on a basis of a result of detection of the data pattern by a process of the pattern detecting step and a result of detection of the shift between the periods of the phases by a process of the phase period shift detecting step.

A PLL circuit (for example a PLL 24 in FIG. 5) according to an embodiment of the present invention that compares an output signal from an oscillator (for example a voltage-controlled oscillator 66 in FIG. 5) with a supplied data signal to detect a difference in frequency and phase, and supplies a feedback to the oscillator to generate a clock signal includes: first determining means (for example a frequency lock detecting unit 65 in FIG. 5) for determining whether frequency of the generated clock signal is locked to a predetermined frequency based on a reference clock; second determining means (for example a phase lock detecting unit 62 in FIG. 5) for determining whether a phase of the generated clock signal is correctly locked; third determining means (for example a false lock detecting unit 63 in FIG. 5) for determining whether the generated clock signal is in a false lock state with respect to the data signal; and control means (for example a frequency dividing ratio control unit 72 in FIG. 5) for controlling a frequency dividing ratio of the output signal from the oscillator on a basis of results of determination of the first determining means, the second determining means, and the third determining means; wherein the third determining means includes data signal input means (for example a data signal input part 91 in FIG. 6) for receiving an input of the data signal, clock signal input means (for example a clock signal input part 92 in FIG. 6) for receiving an input of the clock signal (for example an output of an N frequency divider 70 in FIG. 5) generated from the data signal, pattern detecting means (for example a pattern detecting unit 101 in FIG. 6) for obtaining the data signal on a basis of the clock signal, and detecting a data pattern in which adjacent pieces of data at at least three consecutive bits differ from each other (for example 101 or 010), phase period shift detecting means (for example a period shift detecting unit 102 in FIG. 6) for detecting a shift between periods of phases at a change point of the data signal and a change point of the clock signal, and determining means (for example a determining unit 103 in FIG. 6) for determining whether a false lock has occurred on a basis of results of detection of the pattern detecting means and the phase period shift detecting means.

A clock data recovery method according to an embodiment of the present invention for a PLL circuit (for example a PLL 24 in FIG. 5) that compares an output signal from an oscillator (for example a voltage-controlled oscillator 66 in FIG. 5) with a supplied data signal to detect a difference in frequency and phase, and supplies a feedback to the oscillator to generate a clock signal includes: a first determining step (for example a process of step S5 in FIG. 15) of determining whether frequency of the generated clock signal is locked to a predetermined frequency based on a reference clock; a second determining step (for example a process of step S10 and step S11 in FIG. 15) of determining whether the generated clock signal is in a false lock state with respect to the data signal; a third determining step (for example a process of step S9 in FIG. 15) of determining whether a phase of the generated clock signal is correctly locked; and a control step (for example a process of step S12 and step S13 in FIG. 15) of controlling a frequency dividing ratio of the output signal from the oscillator on a basis of results of determination by processes of the first determining step, the second determining step, and the third determining step; wherein the second determining step includes a pattern detecting step (for example a process of step S32 in FIG. 16) of obtaining the data signal on a basis of the clock signal, and detecting a data pattern in which adjacent pieces of data at at least three consecutive bits differ from each other (for example 101 or 010), a phase period shift detecting step (for example a process of step S33 in FIG. 16) of detecting a shift between periods of phases at a change point of the data signal and a change point of the clock signal, and an output step (for example a process of step S36 or step S37 in FIG. 16) of outputting a signal indicating whether a false lock has occurred on a basis of a result of detection of the data pattern by a process of the pattern detecting step and a result of detection of the shift between the periods of the phases by a process of the phase period shift detecting step.

Figure 4:
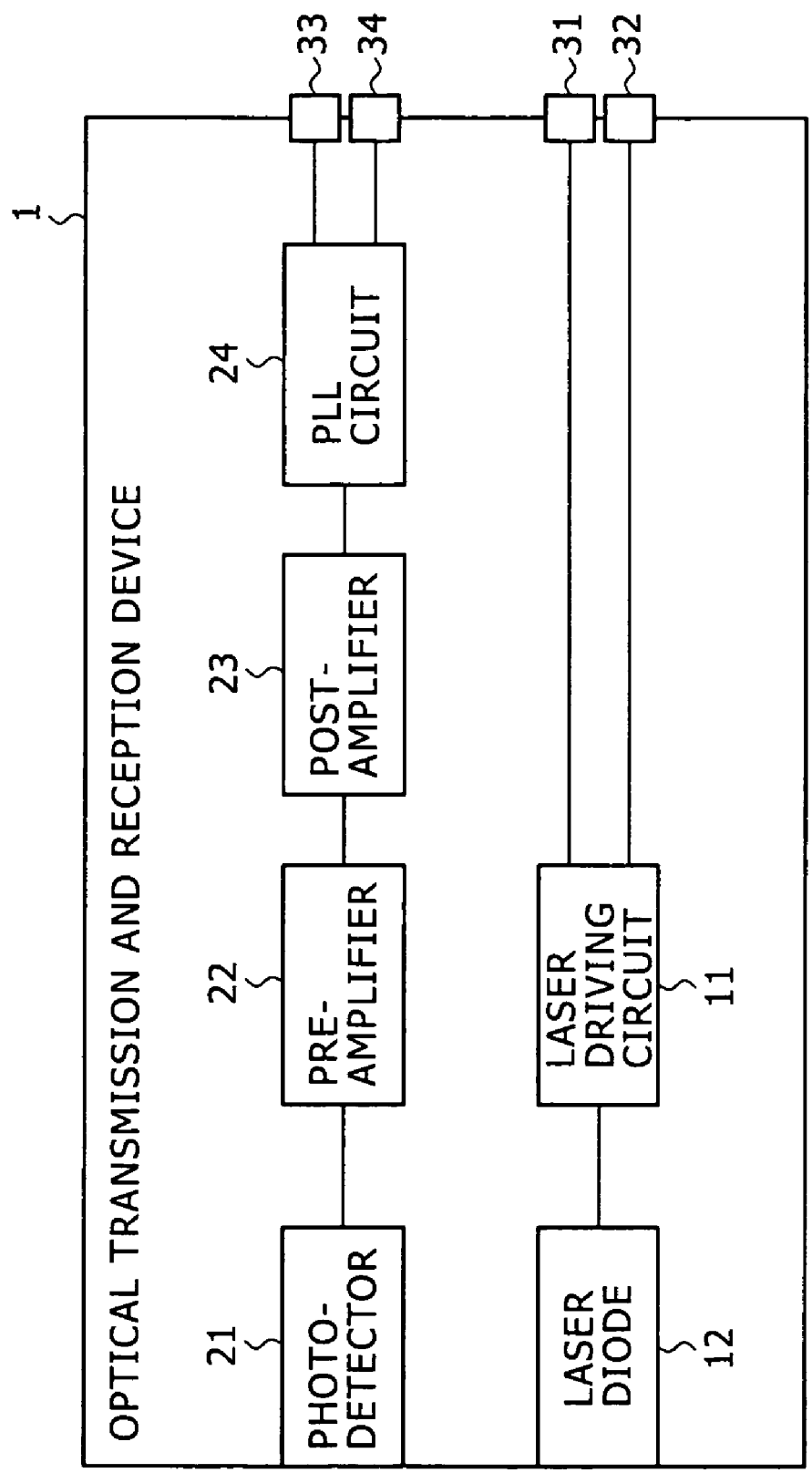
FIG. 4 is a block diagram showing a configuration of an optical transmission and reception device to which the present invention is applied.

A communication device (for example an optical transmission and reception device 1 in FIG. 4) according to an embodiment of the present invention includes: receiving means (for example a photodetector 21 in FIG. 4) for receiving a data signal; and clock signal generating means (for example a PLL circuit 24 in FIG. 4) for generating a clock signal from the data signal received by the receiving means, using principles of a PLL; wherein the clock signal generating means includes first determining means (for example a frequency lock detecting unit 65 in FIG. 5) for determining whether frequency of the generated clock signal is locked to a predetermined frequency based on a reference clock, second determining means (for example a phase lock detecting unit 62 in FIG. 5) for determining whether a phase of the generated clock signal is correctly locked, third determining means (for example a false lock detecting unit 63 in FIG. 5) for determining whether the generated clock signal is in a false lock state with respect to the data signal, and control means (for example a frequency dividing ratio control unit 72 in FIG. 5) for controlling a frequency dividing ratio of an output signal from an oscillator on a basis of results of determination of the first determining means, the second determining means, and the third determining means, and wherein the third determining means includes data signal input means (for example a data signal input part 91 in FIG. 6) for receiving an input of the data signal, clock signal input means (for example a clock signal input part 92 in FIG. 6) for receiving an input of the clock signal (for example an output of an N frequency divider 70 in FIG. 5) generated from the data signal, pattern detecting means (for example a pattern detecting unit 101 in FIG. 6) for obtaining the data signal on a basis of the clock signal, and detecting a data pattern in which adjacent pieces of data at at least three consecutive bits differ from each other (for example 101 or 010), phase period shift detecting means (for example a period shift detecting unit 102 in FIG. 6) for detecting a shift between periods of phases at a change point of the data signal and a change point of the clock signal, and determining means (for example a determining unit 103 in FIG. 6) for determining whether a false lock has occurred on a basis of results of detection of the pattern detecting means and the phase period shift detecting means.

A communication method according to an embodiment of the present invention for a communication device (for example an optical transmission and reception device 1 in FIG. 4) that receives a data signal, compares an output signal from an oscillator (for example a voltage-controlled oscillator 66 in FIG. 5) with the received data signal to detect a difference in frequency and phase, and supplies a feedback to the oscillator to generate a clock signal includes: a first determining step (for example a process of step S5 in FIG. 15) of determining whether frequency of the generated clock signal is locked to a predetermined frequency based on a reference clock; a second determining step (for example a process of step S10 and step S11 in FIG. 15) of determining whether the generated clock signal is in a false lock state with respect to the data signal; a third determining step (for example a process of step S9 in FIG. 15) of determining whether a phase of the generated clock signal is correctly locked; and a control step (for example a process of step S12 and step S13 in FIG. 15) of controlling a frequency dividing ratio of the output signal from the oscillator on a basis of results of determination by processes of the first determining step, the second determining step, and the third determining step; wherein the second determining step includes a pattern detecting step (for example a process of step S32 in FIG. 16) of obtaining the data signal on a basis of the clock signal, and detecting a data pattern in which adjacent pieces of data at at least three consecutive bits differ from each other (for example 101 or 010), a phase period shift detecting step (for example a process of step S33 in FIG. 16) of detecting a shift between periods of phases at a change point of the data signal and a change point of the clock signal, and an output step (for example a process of step S36 or step S37 in FIG. 16) of outputting a signal indicating whether a false lock has occurred on a basis of a result of detection of the data pattern by a process of the pattern detecting step and a result of detection of the shift between the periods of the phases by a process of the phase period shift detecting step.

An optical disk reproducing device (for example an optical disk reproducing device 231 in FIG. 17) according to an embodiment of the present invention includes: detecting means (for example a detector 252 and a binarizing circuit 253 in FIG. 17) for detecting a data signal recorded on an optical disk; and clock signal generating means (for example a PLL circuit 256 in FIG. 17) for generating a clock signal from the data signal detected by the detecting means, using principles of a PLL; wherein the clock signal generating means includes first determining means (for example a frequency lock detecting unit 65 in FIG. 5) for determining whether frequency of the generated clock signal is locked to a predetermined frequency based on a reference clock, second determining means (for example a phase lock detecting unit 62 in FIG. 5) for determining whether a phase of the generated clock signal is correctly locked, third determining means (for example a false lock detecting unit 63 in FIG. 5) for determining whether the generated clock signal is in a false lock state with respect to the data signal, and control means (for example a frequency dividing ratio control unit 72 in FIG. 5) for controlling a frequency dividing ratio of an output signal from an oscillator on a basis of results of determination of the first determining means, the second determining means, and the third determining means, and wherein the third determining means includes data signal input means (for example a data signal input part 91 in FIG. 6) for receiving an input of the data signal, clock signal input means (for example a clock signal input part 92 in FIG. 6) for receiving an input of the clock signal (for example an output of an N frequency divider 70 in FIG. 5) generated from the data signal, pattern detecting means (for example a pattern detecting unit 101 in FIG. 6) for obtaining the data signal on a basis of the clock signal, and detecting a data pattern in which adjacent pieces of data at at least three consecutive bits differ from each other (for example 101 or 010), phase period shift detecting means (for example a period shift detecting unit 102 in FIG. 6) for detecting a shift between periods of phases at a change point of the data signal and a change point of the clock signal, and determining means (for example a determining unit 103 in FIG. 6) for determining whether a false lock has occurred on a basis of results of detection of the pattern detecting means and the phase period shift detecting means.

An optical disk reproducing method according to an embodiment of the present invention for an optical disk reproducing device (for example an optical disk reproducing device 231 in FIG. 17) that detects a data signal recorded on an optical disk, compares an output signal from an oscillator (for example a voltage-controlled oscillator 66 in FIG. 5) with the detected data signal to detect a difference in frequency and phase, and supplies a feedback to the oscillator to generate a clock signal includes: a first determining step (for example a process of step S5 in FIG. 15) of determining whether frequency of the generated clock signal is locked to a predetermined frequency based on a reference clock; a second determining step (for example a process of step S10 and step S11 in FIG. 15) of determining whether the generated clock signal is in a false lock state with respect to the data signal; a third determining step (for example a process of step S9 in FIG. 15) of determining whether a phase of the generated clock signal is correctly locked; and a control step (for example a process of step S12 and step S13 in FIG. 15) of controlling a frequency dividing ratio of the output signal from the oscillator on a basis of results of determination by processes of the first determining step, the second determining step, and the third determining step; wherein the second determining step includes a pattern detecting step (for example a process of step S32 in FIG. 16) of obtaining the data signal on a basis of the clock signal, and detecting a data pattern in which adjacent pieces of data at at least three consecutive bits differ from each other (for example 101 or 010), a phase period shift detecting step (for example a process of step S33 in FIG. 16) of detecting a shift between periods of phases at a change point of the data signal and a change point of the clock signal, and an output step (for example a process of step S36 or step S37 in FIG. 16) of outputting a signal indicating whether a false lock has occurred on a basis of a result of detection of the data pattern by a process of the pattern detecting step and a result of detection of the shift between the periods of the phases by a process of the phase period shift detecting step.

A preferred embodiment of the present invention will hereinafter be described with reference to the drawings.

FIG. 4 is a block diagram showing a configuration of an optical transmission and reception device 1 to which the present invention is applied.

A laser driving circuit 11 drives a laser diode 12 on the basis of a data signal of data to be transmitted which signal is input from a data signal input part 31 and a clock of the data to be transmitted which clock is input from a clock signal input part 32. The laser diode 12 emits laser light under control of the laser driving circuit 11, and thereby transmits the data in a frequency band conforming to specifications of an optical fiber cable not shown in the figure.

A photodetector 21 receives light transmitted from the optical fiber cable not shown in the figure, converts the light into an electric signal, and then supplies the electric signal to a preamplifier 22. The preamplifier 22 is an amplifier in a pre-stage. The preamplifier 22 amplifies the supplied signal, and then supplies the amplified signal to a post-amplifier 23. The post-amplifier 23 further amplifies the supplied signal so as to make signal processing in a succeeding stage possible, and then supplies the amplified signal to a PLL circuit 24.

The PLL circuit 24 has a multi-rate capability and has a function of automatically selecting a rate. The PLL circuit 24 receives a reference clock signal supplied from a reference clock generating unit not shown in the figure. The PLL circuit 24 outputs the data signal from a data signal output part 33. Also, the PLL circuit 24 detects (generates) a clock signal from the data signal, and then outputs the clock signal from a clock signal output part 34.

Figure 5:
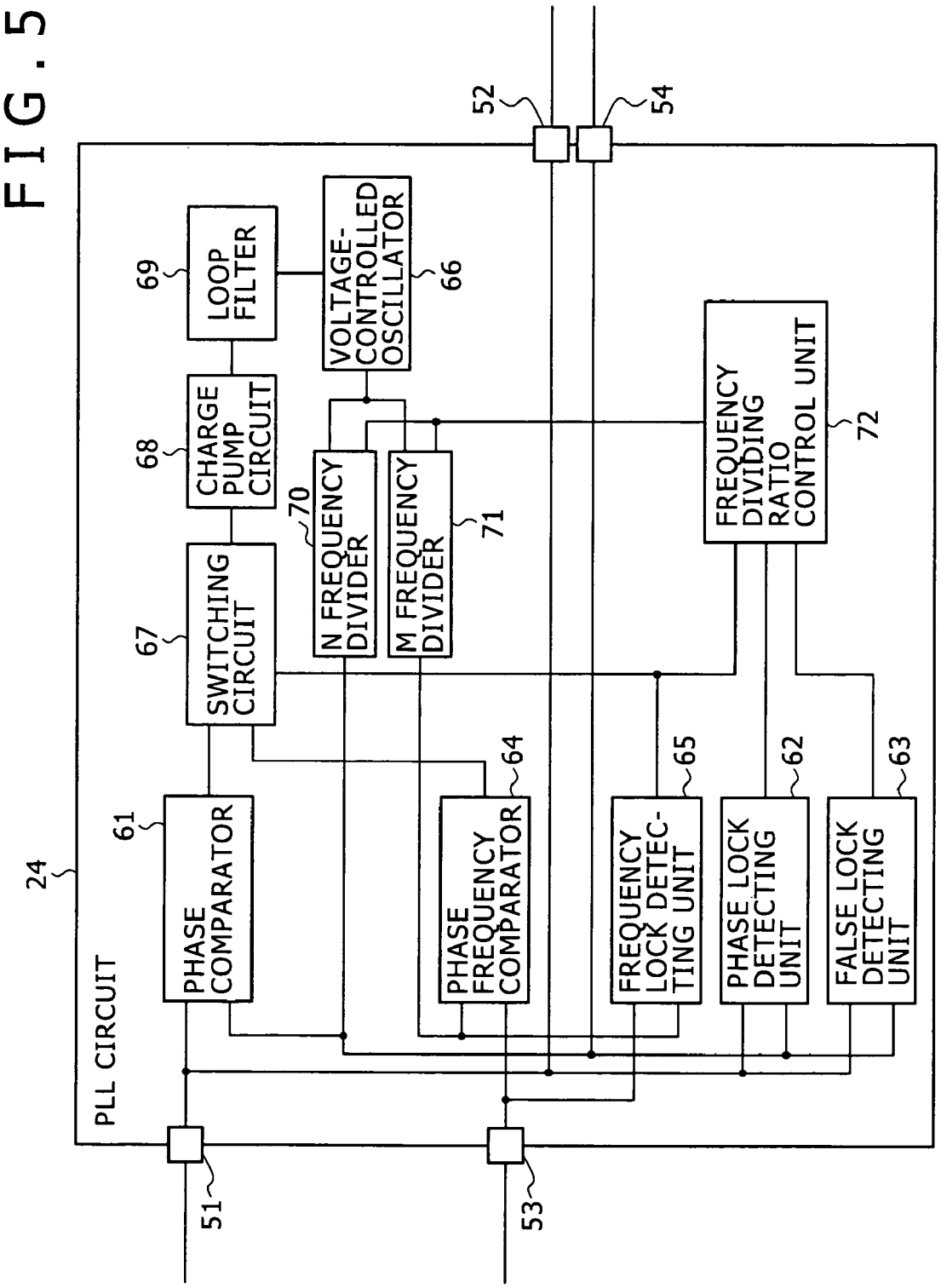
FIG. 5 is a block diagram showing a configuration of a PLL circuit in FIG. 4.

FIG. 5 is a block diagram showing a configuration of the PLL circuit 24 having the multi-rate capability and having the function of automatically selecting a rate which circuit is described with reference to FIG. 4.

The data signal input from a data signal input part 51 is supplied to a phase comparator 61, a phase lock detecting unit 62, and a false lock detecting unit 63, and output from a data signal output part 52. The reference clock input from a reference clock signal input part 53 is supplied to a phase frequency comparator 64 and a frequency lock detecting unit 65.

The frequency lock detecting unit 65 is supplied with the reference clock input from the reference clock signal input part 53 and an output of a voltage-controlled oscillator 66 after frequency division by M. The frequency lock detecting unit 65 determines whether the frequency is locked to a predetermined frequency based on the reference clock. The frequency lock detecting unit 65 supplies a result of the determination to a switching circuit 67 and a frequency dividing ratio control unit 72. On the basis of the result of the determination by the frequency lock detecting unit 65, the switching circuit 67 supplies one of outputs of the phase comparator 61 and the phase frequency comparator 64 to a charge pump circuit 68. The switching circuit 67 first supplies the output of the phase frequency comparator 64 to the charge pump circuit 68. The switching circuit 67 may be included in the charge pump circuit 68, and the switching function may be added to functions of the charge pump circuit 68.

The charge pump circuit 68 is a circuit for controlling an amount of charge stored in a loop filter 69. The loop filter 69 removes high-frequency noise from a signal supplied thereto, and thus converts an output of the charge pump circuit 68 into a control voltage for controlling the voltage-controlled oscillator 66. The voltage-controlled oscillator 66 controls an oscillation frequency on the basis of the control voltage supplied from the loop filter 69.

An M frequency divider 71 divides the output of the voltage-controlled oscillator 66 by a frequency dividing ratio M based on control of the frequency dividing ratio control unit 72, and then outputs the output of the voltage-controlled oscillator 66 after the frequency division by M to the phase frequency comparator 64 and the frequency lock detecting unit 65. The phase frequency comparator 64 compares the reference clock input from the reference clock signal input part 53 with the output of the voltage-controlled oscillator 66 after the frequency division by M. The phase frequency comparator 64 supplies a result of the comparison to the charge pump circuit 68 via the switching circuit 67. Thereby the oscillation frequency of the voltage-controlled oscillator 66 is locked to the reference clock×M.

Then, the frequency lock detecting unit 65 is supplied with the reference clock input from the reference clock signal input part 53 and the output of the voltage-controlled oscillator 66 after the frequency division by M which output is supplied from the M frequency divider 71 to determine whether the frequency of the voltage-controlled oscillator 66 is locked to the reference clock×M. The frequency lock detecting unit 65 supplies a result of the determination to the frequency dividing ratio control unit 72. Also, when the frequency lock detecting unit 65 determines that the frequency of the voltage-controlled oscillator 66 is locked to the reference clock×M, the frequency lock detecting unit 65 controls the switching circuit 67 to change the signal supplied to the charge pump circuit 68 to the signal output from the phase comparator 61.

An N frequency divider 70 divides the output of the voltage-controlled oscillator 66 by a frequency dividing ratio N based on control of the frequency dividing ratio control unit 72. The N frequency divider 70 supplies the output of the voltage-controlled oscillator 66 after the frequency division by N to the phase comparator 61, the phase lock detecting unit 62, and the false lock detecting unit 63 as well as a clock signal output part 54. Then the phase comparator 61 compares a phase of the output of the voltage-controlled oscillator 66 after the frequency division by N which output is supplied from the N frequency divider 70 with a phase of the data signal input from the data signal input part 51. The phase comparator 61 supplies a result of the comparison to the charge pump circuit 68 via the switching circuit 67. Thereby the phase of the voltage-controlled oscillator 66 is locked to the data signal input from the data signal input part 51.

The phase lock detecting unit 62 is supplied with the output of the voltage-controlled oscillator 66 after the frequency division by N which output is supplied from the N frequency divider 70 and the data signal input from the data signal input part 51 to determine whether the phase of the voltage-controlled oscillator 66 is locked to the phase of the data signal input from the data signal input part 51. The phase lock detecting unit 62 supplies a result of the determination to the frequency dividing ratio control unit 72. The false lock detecting unit 63 is supplied with the output of the voltage-controlled oscillator 66 after the frequency division by N and the data signal input from the data signal input part 51 to determine whether the output of the voltage-controlled oscillator 66 is in a false lock state with respect to the data signal. The false lock detecting unit 63 supplies a result of the determination to the frequency dividing ratio control unit 72. Details of the false lock detecting unit 63 will be described later.

The frequency dividing ratio control unit 72 controls the frequency dividing ratios of the M frequency divider 71 and the N frequency divider 70 in each cyclic time on the basis of the lock detection results of the frequency lock detecting unit 65, the phase lock detecting unit 62, and the false lock detecting unit 63. When a data rate of the data signal input from the data signal input part 51 coincides with a target data rate to which the PLL circuit 24 intends to lock clock frequency, the frequency lock detecting unit 65, the phase lock detecting unit 62, and the false lock detecting unit 63 supply the frequency dividing ratio control unit 72 with a signal indicating that the clock frequency is correctly locked, and therefore the frequency dividing ratio control unit 72 maintains the frequency dividing ratios of the M frequency divider 71 and the N frequency divider 70. When the data rate of the data signal input from the data signal input part 51 does not coincide with the target data rate to which the PLL circuit 24 intends to lock the clock frequency, at least one of the frequency lock detecting unit 65, the phase lock detecting unit 62, and the false lock detecting unit 63 supplies the frequency dividing ratio control unit 72 with a signal indicating that the clock frequency is not correctly locked, and therefore the frequency dividing ratio control unit 72 controls the frequency dividing ratios of the M frequency divider 71 and the N frequency divider 70 to lock the clock frequency to another data rate than the present target data rate.

For example, description will be made of a case where the PLL circuit 24 automatically selects three rates of 540 Mbps, 270 Mbps, and 150 Mbps, tries locking in a 540 Mbps mode at the time of turning on power or at the time of reset, and thereafter locks the clock while cycling a value of the target data rate in order of 540 Mbps, 270 Mbps, 150 Mbps, 540 Mbps, 270 Mbps, 150 Mbps, . . . . Incidentally, the cycling of the value of the data rate may be in order reverse to that of this example or in different order. Suppose that a time interval of each mode in the cycling is set in advance to a sufficient time for locking in each mode. In this case, suppose that the reference clock input from the reference clock signal input part 53 is 10 MHz, and suppose that the oscillation frequency of the voltage-controlled oscillator 66 is 900 MHz to 1100 MHz.

Suppose that the frequency dividing ratio of the M frequency divider 71 is 108 in the 540 Mbps mode, 108 in a 270 Mbps mode, and 100 in a 150 Mbps mode. Hence, the oscillation frequency of the voltage-controlled oscillator 66 is 1080 MHz, 1080 MHz, and 1000 MHz in the respective modes. The frequency dividing ratio of the N frequency divider 70 is 2 in the 540 Mbps mode, 4 in the 270 Mbps mode, and 10 in the 150 Mbps mode.

Assuming in this case that a data signal of 270 Mbps is input, in the 540 Mbps mode, the false lock detecting unit 63 detects a false lock, and a cyclic time passes. As a result, the frequency dividing ratio control unit 72 changes the mode to the 270 Mbps mode. Then, in the 270 Mbps mode, each of the frequency lock detecting unit 65, the phase lock detecting unit 62, and the false lock detecting unit 63 determines that the clock signal is normally locked to the data signal. Therefore the frequency dividing ratio control unit 72 maintains the same data rate after the passage of a cyclic time. When the clock signal goes out of the locked state due to some disturbance, a process of the frequency dividing ratio control unit 72 changes the operating mode to the 150 Mbps mode, then through the 540 Mbps mode to the 270 Mbps mode again, in which the clock signal is locked.

Thus, the clock signal output from the clock signal output part 54, that is, the output of the N frequency divider 70 is stabilized as clock signal correctly locked to the data signal.

FIG. 6 is a block diagram showing a detailed configuration of the false lock detecting unit 63 in FIG. 5.

The data signal input from the data signal input part 51 of the PLL circuit 24 described with reference to FIG. 5 is input to a data signal input part 91, and then supplied to a pattern detecting unit 101 and a period shift detecting unit 102. The clock signal output from the N frequency divider 70 in the PLL circuit 24 described with reference to FIG. 5 (that is, the clock signal output from the clock signal output part 54 of the PLL circuit 24 described with reference to FIG. 5) is input to a clock signal input part 92, and then supplied to the pattern detecting unit 101 and the period shift detecting unit 102. Further, a detection enable signal input part 94 of the false lock detecting unit 63 is supplied with an enable signal that sets false lock detection operation in an enabled state.

The false lock detecting unit 63 performs false lock detection operation correctly while a normal lock state or a false lock state continues stably, but operates differently in a process of reaching a stable state. Therefore the false lock detecting unit 63 starts the operation when supplied with an input of a signal indicating that a normal lock state or a false lock state is continuing stably from the detection enable signal input part 94. The signal input to the detection enable signal input part 94 may be any signal as long as the signal indicates that a normal lock state or a false lock state is continuing stably.

For example, a lock detection circuit is used for a related-art ordinary clock data recovery circuit. While this lock detection circuit cannot distinguish between a normal lock state and a false lock state, the lock detection circuit can determine whether the state is a stable state. Hence, by inputting an output of the related-art lock detection circuit to the detection enable signal input part 94, the false lock detecting unit 63 can perform the false lock detection operation only at the time of a stable state.

When capturing the data signal in timing of the supplied clock signal, the pattern detecting unit 101 detects whether the captured data signal changes at all of three consecutive bits, that is, whether a data pattern is (0, 1, 0) or (1, 0, 1). The pattern detecting unit 101 supplies a result of the detection to a determining unit 103.

Figure 2:
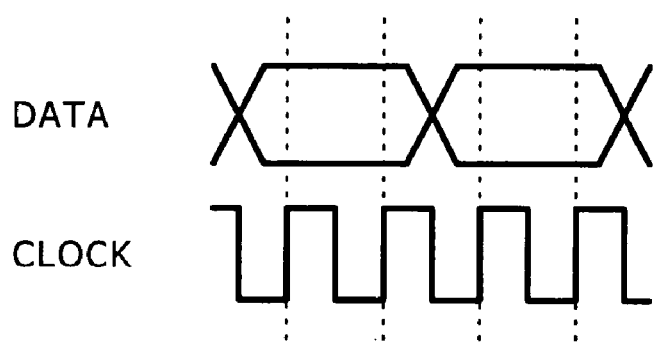
FIG. 2 is a diagram of assistance in explaining a case in which m=1 where a ratio of data rate to clock frequency is m:n in a false lock state.
Figure 3:
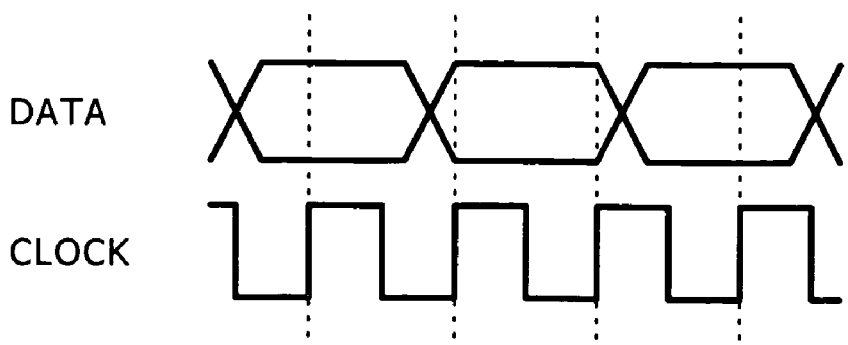
FIG. 3 is a diagram of assistance in explaining a case in which m.1 where the ratio of the data rate to the clock frequency is m:n in a false lock state.

A probability of detecting (0, 1, 0) or (1, 0, 1) at three consecutive bits in random data is about 25% in a normal lock state, 0% in a false lock state in which m=1 where a ratio of the data rate to the clock frequency is m:n, and 0% to 25% in a false lock state in which m.1 where the ratio of the data rate to the clock frequency is m:n. In a false lock state in which m=1 where the ratio of the data rate to the clock frequency is m:n, consecutive clocks capture same data twice or more as shown in FIG. 2 described above, and hence a probability of occurrence of (0, 1, 0) or (1, 0, 1) at three consecutive bits in random data is 0%.

Thus, when the pattern detecting unit 101 detects that the captured data signal is (0, 1, 0) or (1, 0, 1), it is known that the lock state is not a false lock state in which m=1 where the ratio of the data rate to the clock frequency is m:n. Details of the pattern detecting unit 101 will be described later with reference to FIG. 7.

The period shift detecting unit 102 detects a shift between a data period and a clock period, that is, a shift between periods of phases at a change point of the data signal and a change point of the clock signal. The period shift detecting unit 102 supplies a result of the detection to the determining unit 103. When a shift between periods of phases at a change point of the data signal and a change point of the clock signal occurs, a false lock state in which m.1 where the ratio of the data rate to the clock frequency is m:n can be detected. Details of the period shift detecting unit 102 will be described later with reference to FIG. 10.

The determining unit 103 determines whether a false lock has occurred on the basis of results of the detection of the pattern detecting unit 101 and the period shift detecting unit 102. The determining unit 103 outputs a result of the determination via a determination signal output part 93. Details of the determining unit 103 will be described later with reference to FIG. 14.

Incidentally, while FIG. 6 shows that the detection enable signal generated outside the false lock detecting unit 63 is supplied to the detection enable signal input part 94, the false lock detecting unit 63 may include a related-art lock detection circuit, for example, for generating the detection enable signal. Further, on the basis of the detection enable signal, the false lock detecting unit 63 may be able to control operation of all of the pattern detecting unit 101, the period shift detecting unit 102, and the determining unit 103, or may control only the operation of the determining unit 103 to prevent output of a result of determination in an unstable state.

Figure 7:
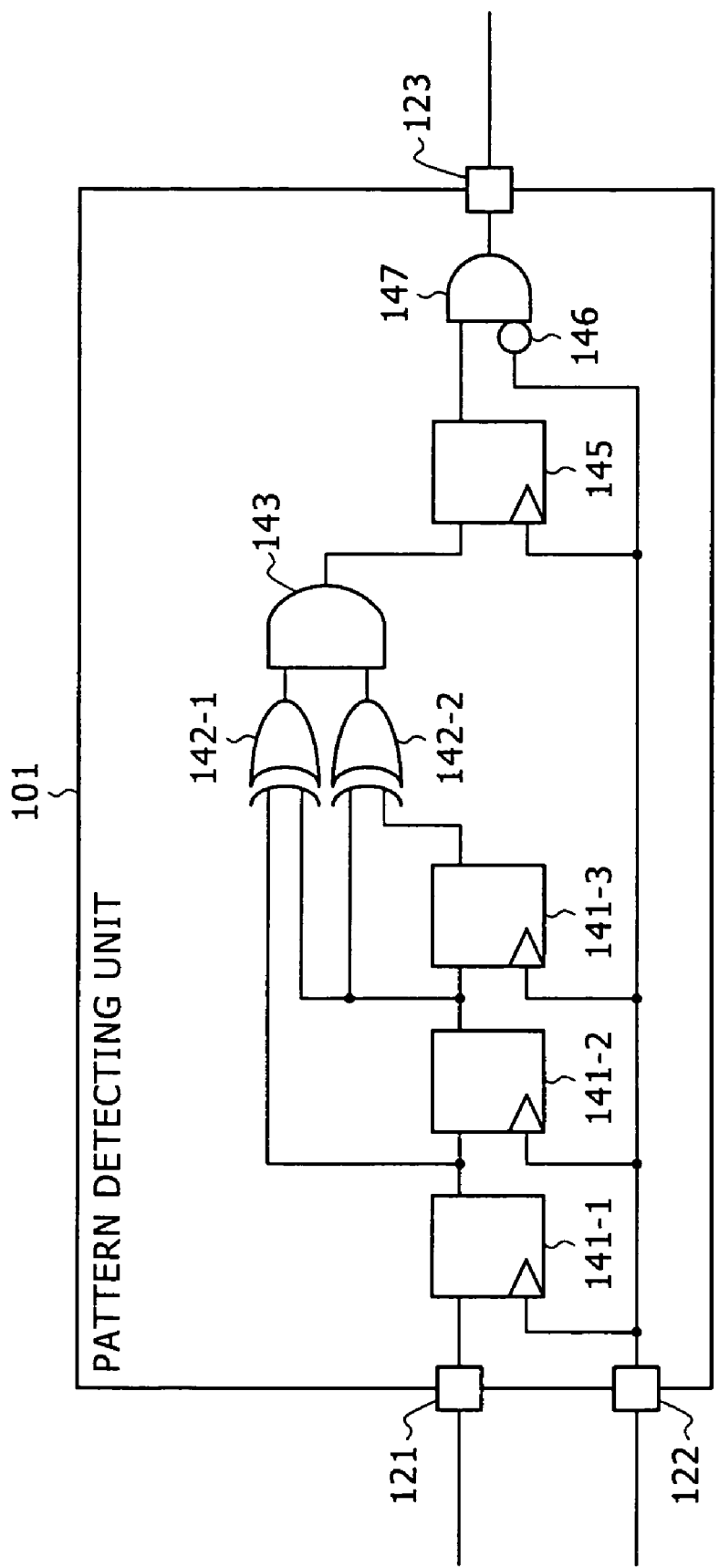
FIG. 7 is a block diagram showing an example of circuit configuration of a pattern detecting unit in FIG. 6.

FIG. 7 is a block diagram showing an example of circuit configuration of the pattern detecting unit 101 in FIG. 6.

A data signal input part 121 receives an input of the data signal input to the data signal input part 91 in FIG. 6, that is, the data signal input from the data signal input part 51 of the PLL circuit 24 described with reference to FIG. 5. A clock signal input part 122 receives an input of the clock signal input to the clock signal input part 92 in FIG. 6, that is, the clock signal output from the N frequency divider 70 in the PLL circuit 24 described with reference to FIG. 5 (the clock signal output from the clock signal output part 54 of the PLL circuit 24 described with reference to FIG. 5).

D flip-flops 141-1 to 141-3 latch input data in timing of a rising edge of the clock signal input from the clock signal input part 122. Hence, an output of the D flip-flops 141-1 to 141-3 is a data signal corresponding to three clocks of the data signal input from the data signal input part 121.

An EXOR 142-1 is supplied with output signals of the D flip-flops 141-1 to 141-2. An EXOR 142-2 is supplied with output signals of the D flip-flops 141-2 to 141-3. Each of the EXOR 142-1 and the EXOR 142-2 outputs zero to an AND 143 when the supplied signals coincide with each other, and outputs one to the AND 143 when the supplied signals differ from each other. That is, the EXOR 142-1 outputs a signal (1) when the output signals of the D flip-flops 141-1 to 141-2 are (01) or (10), and the EXOR 142-2 outputs a signal (1) when the output signals of the D flip-flops 141-2 to 141-3 are (01) or (10).

The AND 143 outputs a signal (1) when both the output signals of the EXOR 142-1 and the EXOR 142-2 are (1), and outputs a signal (0) when at least one of the output signals of the EXOR 142-1 and the EXOR 142-2 is a signal (0). That is, the AND 143 outputs a signal (1) when the respective output signals of the D flip-flops 141-1 to 141-3 are (1, 0, 1) or (0, 1, 0).

Then, a D flip-flop 145 latches the output of the AND 143 in timing of a rising edge of the clock signal input from the clock signal input part 92. An AND 147 outputs a signal (1) when both an output of the D flip-flop 145 and the clock signal inverted by an inverter 146 are (1). That is, the AND 147 outputs a pulse signal of half a period width of a clock via an output part 123 when the respective output signals of the D flip-flops 141-1 to 141-3 are (1, 0, 1) or (0, 1, 0).

Incidentally, the pattern detecting unit 101 may have a different circuit configuration from that of FIG. 7 as long as the circuit configuration can capture the data signal input from the data signal input part 121 in timing of the clock signal input from the clock signal input part 122, and detect whether all of three consecutive bits in the captured data signal change, that is, whether the data pattern is (0, 1, 0) or (1, 0, 1).

Figure 8:
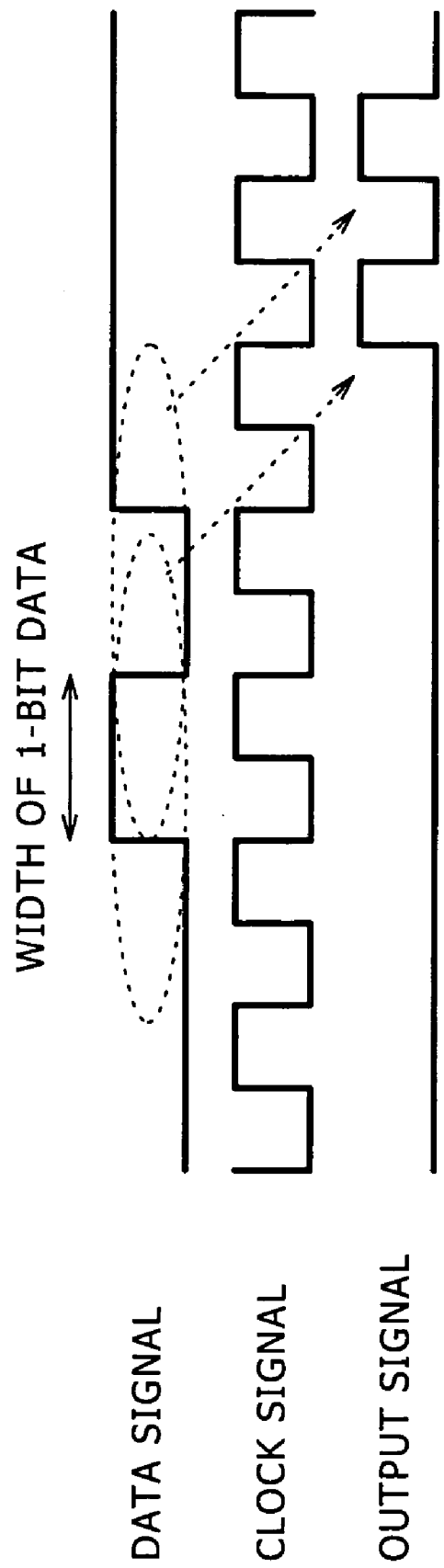
FIG. 8 is a diagram of assistance in explaining an example of input signals and an output signal of the pattern detecting unit in FIG. 7.

FIG. 8 shows an example of the data signal input to the data signal input part 121 of the pattern detecting unit 101, the clock signal input to the clock signal input part 122, and the output signal output from the output part 123 in a normal lock state.

In the case shown in FIG. 8, the clock signal is normally locked to the data signal. Hence, as a result of detection of the data signal at rising edges of the input clock signal, a part where the data signal changes so as to form the pattern (0, 1, 0) and a part where the data signal changes so as to form the pattern (1, 0, 1) are detected with a probability of about 25%. Thus, the output signal output from the output part 123 includes a pulse signal of half a period width of a clock.

Figure 9:
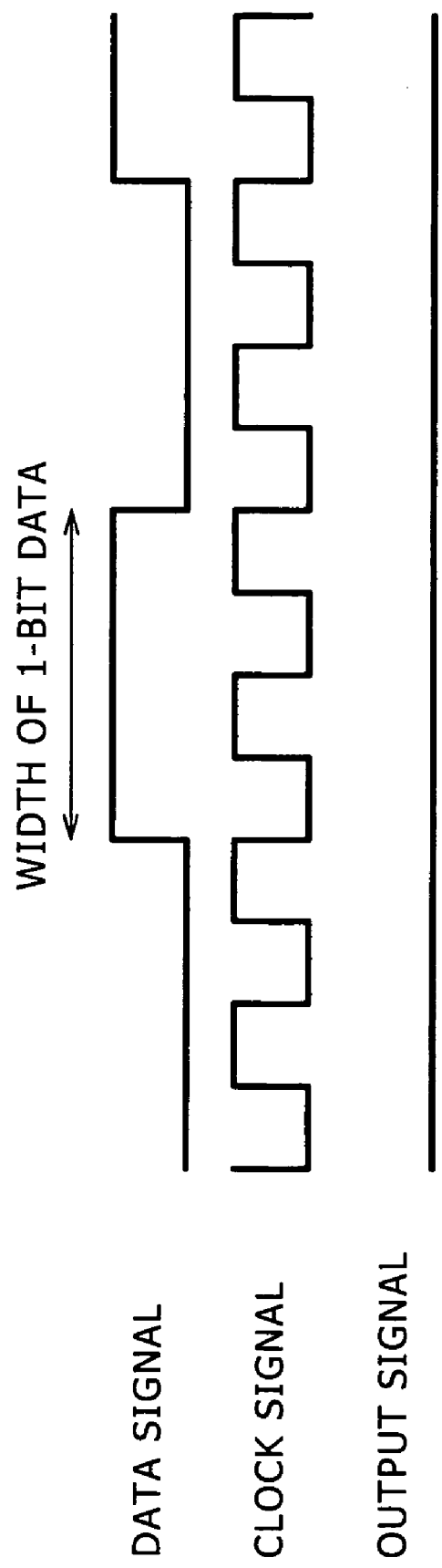
FIG. 9 is a diagram of assistance in explaining an example of input signals and an output signal of the pattern detecting unit in FIG. 7.

Next, FIG. 9 shows an example of the data signal input to the data signal input part 121 of the pattern detecting unit 101, the clock signal input to the clock signal input part 122, and the output signal output from the output part 123 in a false lock state in which the ratio of the data rate to the clock frequency is 1:2.

As described above, in a false lock state in which m=1 where the ratio of the data rate to the clock frequency is m:n, consecutive clocks capture same data twice or more, and hence a probability of occurrence of (0, 1, 0) or (1, 0, 1) at three consecutive bits in random data is 0%.

In the case shown in FIG. 9, the clock signal is in a false lock state with m=1 with respect to the data signal. Hence, even when the data signal is detected at rising edges of the input clock signal, a part where the data signal changes so as to form the pattern (0, 1, 0) and a part where the data signal changes so as to form the pattern (1, 0, 1) are not detected. Thus, the output signal output from the output part 123 does not include a pulse signal of half a period width of a clock.

Figure 10:
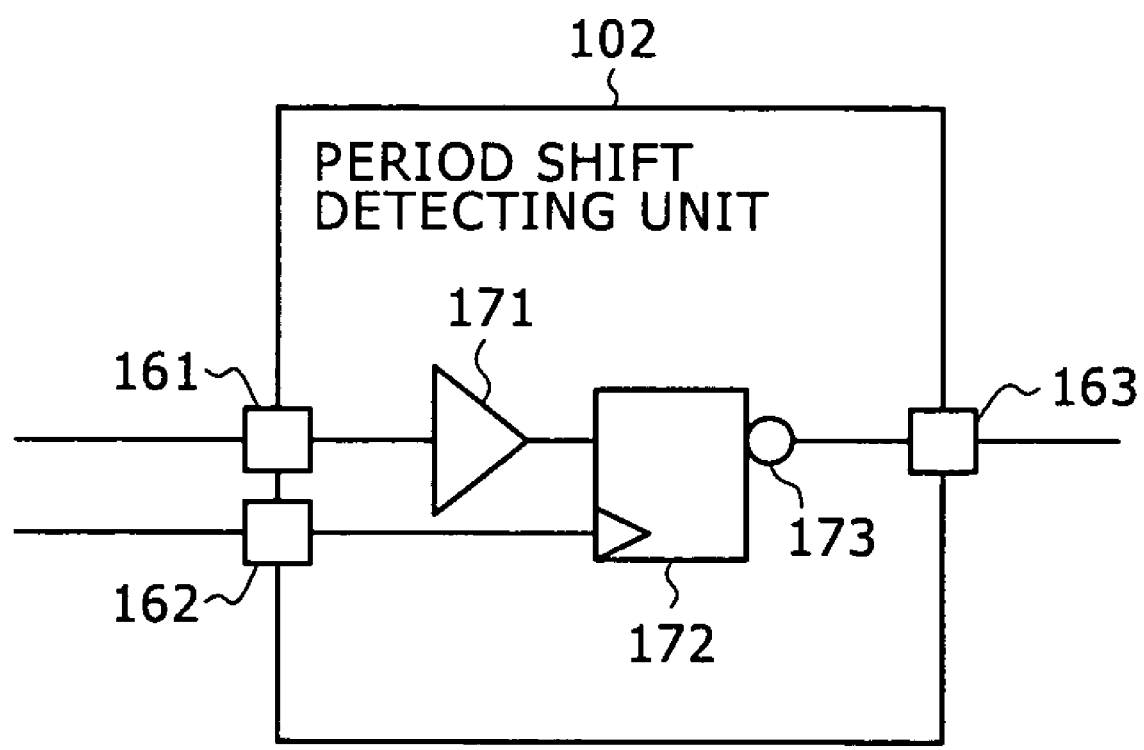
FIG. 10 is a block diagram showing an example of circuit configuration of a period shift detecting unit in FIG. 6.

FIG. 10 is a block diagram showing an example of configuration of the period shift detecting unit 102 in FIG. 6.

A clock signal input part 161 receives an input of the clock signal input to the clock signal input part 92 in FIG. 6, that is, the clock signal output from the N frequency divider 70 in the PLL circuit 24 described with reference to FIG. 5 (the clock signal output from the clock signal output part 54 of the PLL circuit 24 described with reference to FIG. 5). A data signal input part 162 receives an input of the data signal input to the data signal input part 91 in FIG. 6, that is, the data signal input from the data signal input part 51 of the PLL circuit 24 described with reference to FIG. 5.

A buffer 171 delays the clock signal input to the clock signal input part 161 by a desired time, and supplies the delayed clock signal to a D flip-flop 172. The data signal and the clock signal in a normal lock state are in a phase relation as shown in FIG. 1 described above. Therefore, in the configuration example shown in FIG. 10, the buffer 171 is provided to delay the clock signal by a predetermined time so that the clock can be captured stably without causing a metastable state. Incidentally, the delay time of the clock signal is a value that can be set on an experimental basis by a circuit configuration or the like. Further, in a case of a design in which an amount of offset is present between phases of the data and the clock in a normal lock state, the buffer 171 may be omitted.

The D flip-flop 172 captures the delayed clock signal in timing of a rising edge of the data signal input from the data signal input part 162. An output signal of the D flip-flop 172 is inverted by an inverter 173, and then output from an output part 163. Specifically, when level of the delayed clock signal is (1) in timing of a rising edge of the data signal, a signal (0) is output from the output part 163, and when the level of the delayed clock signal is (0) in timing of a rising edge of the data signal, a signal (1) is output from the output part 163.

Figure 11:
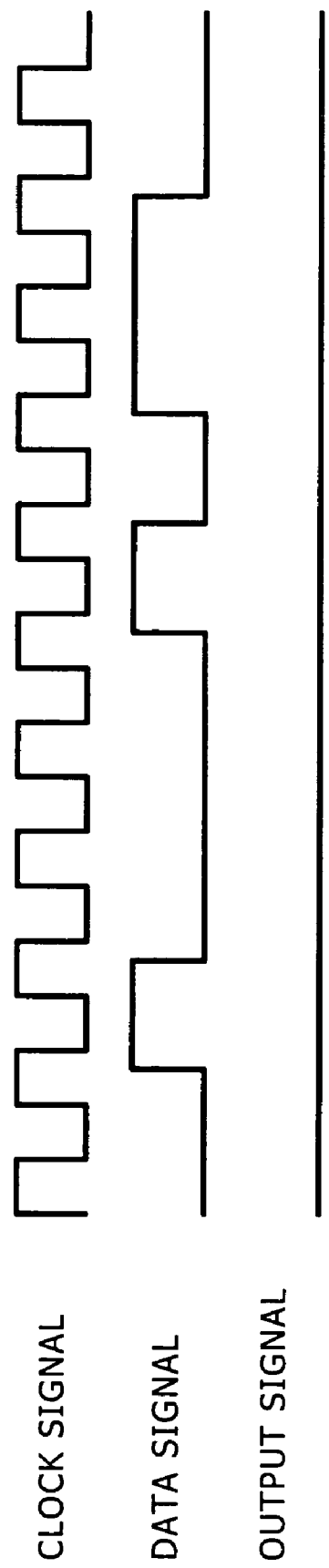
FIG. 11 is a diagram of assistance in explaining an example of input signals and an output signal of the period shift detecting unit in FIG. 10.

FIG. 11 shows an example of the clock signal input to the clock signal input part 161 of the period shift detecting unit 102, the data signal input to the data signal input part 162, and the output signal output from the output part 163 in a normal lock state.

In the case shown in FIG. 11, the clock signal is normally locked to the data signal, and therefore the clock signal is 1 at all rising edges of the input data signal. Therefore the output signal output from the output part 163 is 0 at all times.

Figure 12:
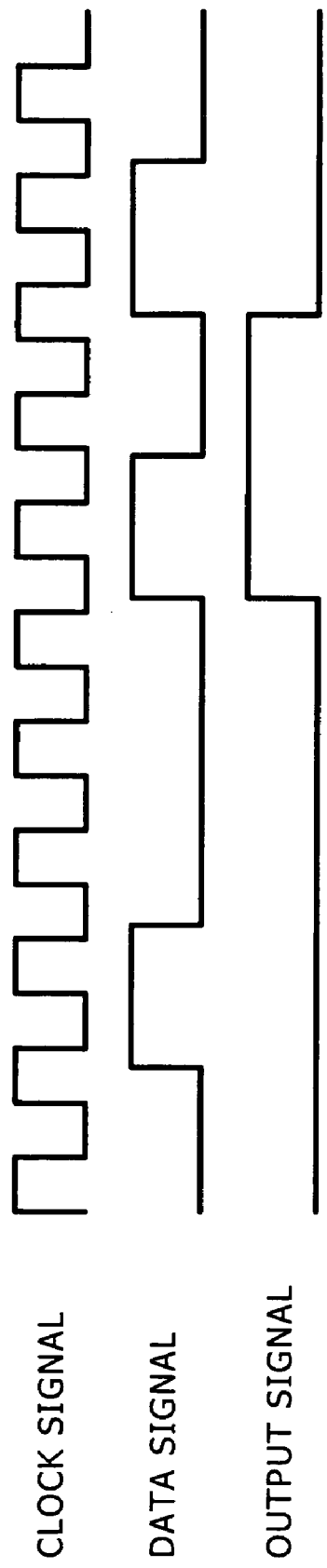
FIG. 12 is a diagram of assistance in explaining an example of input signals and an output signal of the period shift detecting unit in FIG. 10.

Next, FIG. 12 shows an example of the clock signal input to the clock signal input part 161 of the period shift detecting unit 102, the data signal input to the data signal input part 162, and the output signal output from the output part 163 in a false lock state in which m.1 where the ratio of the data rate to the clock frequency is m:n.

Figure 13:
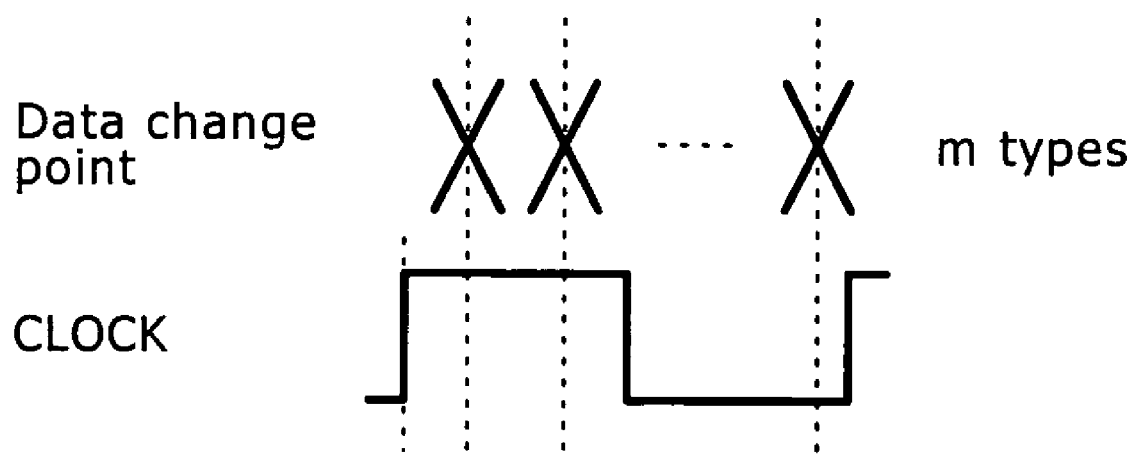
FIG. 13 is a diagram of assistance in explaining relation between a data change point and a clock when m.1 where a ratio of data rate to clock frequency is m:n in a false lock state.

In the case shown in FIG. 12, the clock signal is in a false lock state with m.1 with respect to the data signal. Hence, the clock signal can assume both values (0) and (1) at rising edges of the input data signal. This is because as shown in FIG. 13, m types of phase relation between the rising edge of the data signal and the clock signal are present at equal intervals. Hence, there are (0) and (1) in the output signal output from the output part 163.

Thus, the period shift detecting unit 102 can detect a shift between periods of phases at a change point of the data signal and a change point of the clock signal.

Incidentally, the circuit configuration of the period shift detecting unit 102 described with reference to FIG. 10 is an example, and it is needless to say that the circuit configuration of the period shift detecting unit 102 may be another circuit configuration as long as the circuit configuration can detect a shift between periods of the data and the clock. For example, the period shift detecting unit 102 may latch the clock signal at falling edges of the data signal rather than rising edges.

Figure 14:
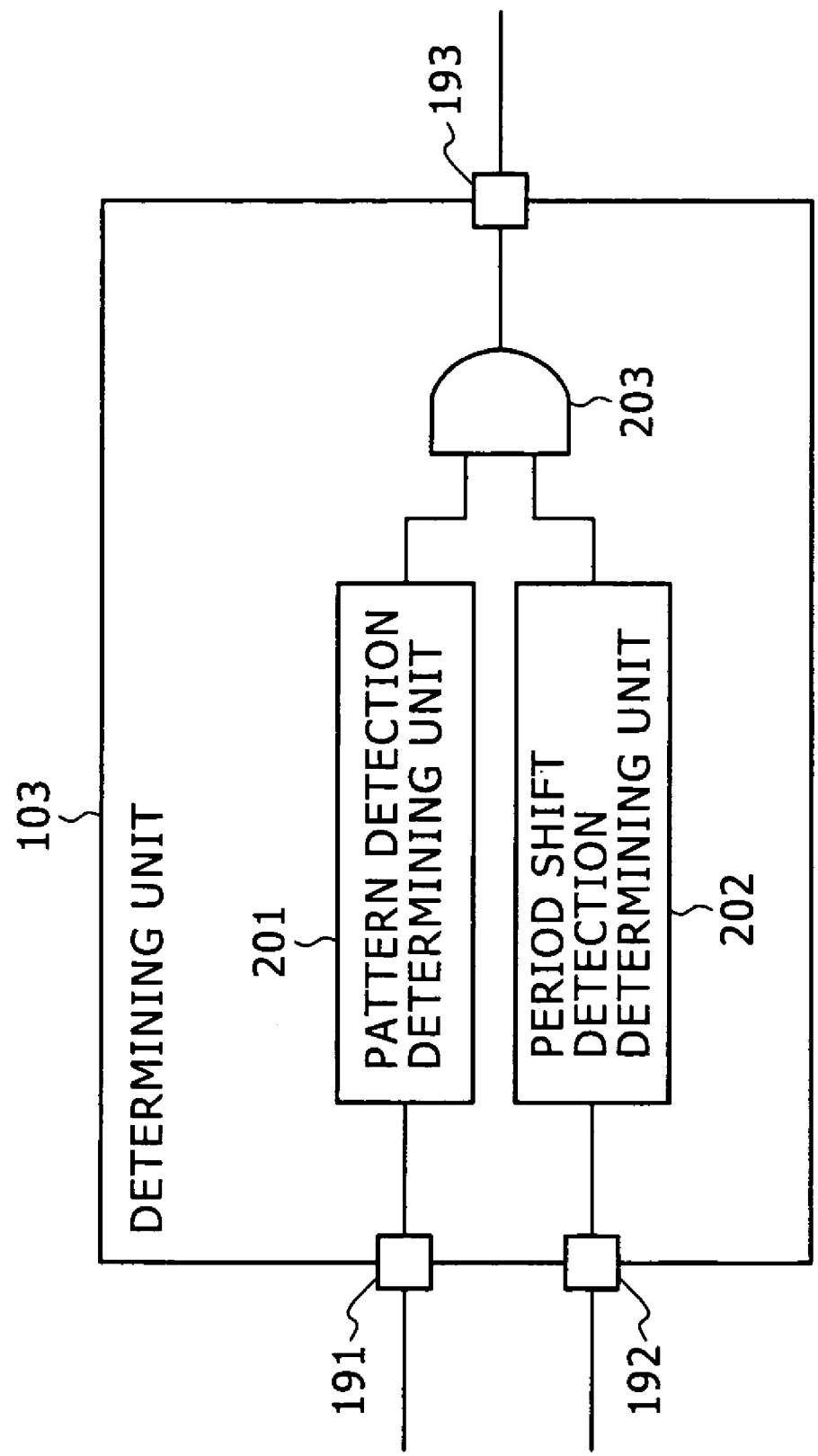
FIG. 14 is a block diagram showing a configuration of a determining unit in FIG. 6.

FIG. 14 is a block diagram showing a configuration of the determining unit 103 in FIG. 6.

A pattern detection input part 191 is supplied with a signal indicating a result of pattern detection which signal is output from the output part 123 of the pattern detecting unit 101. A period shift detection input part 192 is supplied with a signal indicating a result of period shift detection which signal is output from the output part 163 of the period shift detecting unit 102.

A pattern detection determining unit 201 receives an input of the signal indicating the result of pattern detection which signal is output from the output part 123 of the pattern detecting unit 101. The signal output from the output part 123 of the pattern detecting unit 101 described with reference to FIG. 7 includes a pulse of half a period width of a clock which pulse is generated so as to correspond to a data pattern (0, 1, 0) or (1, 0, 1) included with a probability of 25% in a normal lock state and with a probability of 0% in a false lock state in which m=1 where the ratio of the data rate to the clock frequency is m:n. Hence, the pattern detection determining unit 201 determines whether the lock state is a false lock state in which m=1 where the ratio of the data rate to the clock frequency is m:n by for example integrating input pulses with a resistance and a capacitor and comparing the result with a predetermined threshold value, or counting input pulses and comparing the count with a predetermined threshold value. The pattern detection determining unit 201 supplies a result of the determination to an AND 203.

Specifically, in the case where whether the lock state is a false lock state in which m=1 where the ratio of the data rate to the clock frequency is m:n is determined by integrating input pulses with a resistance and a capacitor, when the probability of occurrence of (0, 1, 0) or (1, 0, 1) at three consecutive bits is 25%, a result of integration of input pulses of half a period width of a clock is ⅛ of clock amplitude. Hence, the pattern detection determining unit 201 for example sets a predetermined value such as 1/16 of the clock amplitude or the like as a threshold value, and compares an integrated value obtained by integrating input pulses with the threshold value. When the integrated value is higher than the threshold value, the pattern detection determining unit 201 determines that the lock state is a normal lock state, and outputs a signal (1) to the AND 203, and when the integrated value is lower than the threshold value, the pattern detection determining unit 201 determines that the lock state is a false lock state, and outputs a signal (0) to the AND 203.

In the case where whether the lock state is a false lock state in which m=1 where the ratio of the data rate to the clock frequency is m:n is determined by counting input pulses, that is, counting the number of times that the level of the input signal is inverted, when (0, 1, 0) or (1, 0, 1) is present at three consecutive bits, an input pulse occurs (the level of the input signal is inverted twice). Accordingly, when counting the predetermined number of input pulses or more within a predetermined time, the pattern detection determining unit 201 determines that the lock state is a normal lock state, and outputs a signal (1) to the AND 203, and when the number of input pulses counted within the predetermined time is zero or smaller than the predetermined number, the pattern detection determining unit 201 determines that the lock state is a false lock state, and outputs a signal (0) to the AND 203.

The predetermined time and the predetermined number are values that can be set on an experimental basis or on an empirical basis. A timer for counting the predetermined time may be retained by the pattern detection determining unit 201 therewithin, or an external timer may be used as the timer.

The period shift detection determining unit 202 receives an input of the signal indicating the result of period shift detection which signal is output from the output part 163 of the period shift detecting unit 102. While the signal output from the output part 163 of the period shift detecting unit 102 described with reference to FIG. 10 is (0) at all times in a normal lock state, the signal can assume both values (0) and (1) in a false lock state in which m=1 where the ratio of the data rate to the clock frequency is m:n.

Accordingly, the period shift detection determining unit 202 for example counts input pulses, that is, counts the number of times that the level of the input data is inverted, and compares the count with a predetermined threshold value. The period shift detection determining unit 202 thereby determines whether the lock state is a false lock state in which m.1 where the ratio of the data rate to the clock frequency is m:n. The period shift detection determining unit 202 supplies a result of the determination to the AND 203.

When the number of input pulses counted within a predetermined time is zero or smaller than a predetermined number, the period shift detection determining unit 202 determines that the lock state is a normal lock state, and outputs a signal (1) to the AND 203, and when counting the predetermined number of input pulses or more within the predetermined time, the period shift detection determining unit 202 determines that the lock state is a false lock state, and outputs a signal (0) to the AND 203.

The predetermined time and the predetermined number are values that can be set on an experimental basis or on an empirical basis. A timer for counting the predetermined time may be retained by the period shift detection determining unit 202 therewithin, or an external timer may be used as the timer.

When the output of the pattern detection determining unit 201 is zero, that is, in a false lock state in which m=1 where the ratio of the data rate to the clock frequency is m:n, an output signal from the AND 203 is (0) regardless of whether the output signal of the period shift detection determining unit 202 is (1) or (0), and thus a signal output from a determination signal output part 193 is (0). When the output signal of the period shift detection determining unit 202 is (0), that is, in a false lock state in which m.1 where the ratio of the data rate to the clock frequency is m:n, the output from the AND 203 is (0) regardless of whether the output of the pattern detection determining unit 201 is (1) or (0), and thus the signal output from the determination signal output part 193 is (0). In this case, the signal (0) output from the determination signal output part 193 indicates that the clock is not normally locked and is in a false lock state. When the output of the pattern detection determining unit 201 and the output signal of the period shift detection determining unit 202 are both (1), the output signal from the AND 203 is (1). In this case, the signal (1) output from the determination signal output part 193 indicates that the clock is normally locked.

The signal output from the determination signal output part 193 is the same as the signal output from the determination signal output part 93 of the false lock detecting unit 63 described with reference to FIG. 6. That is, the false lock detecting unit 63 can detect occurrence of a false lock regardless of whether m=1 or whether m.1 where the ratio of the data rate to the clock frequency is m:n.

Incidentally, while description has been made of a logical configuration in FIG. 14 in which the outputs of the pattern detection determining unit 201 and the period shift detection determining unit 202 in the determining unit 103 are output to the AND 203, the logical configuration of the determining unit 103 is not limited to this. In the determining unit 103, the pattern detection determining unit 201 and the period shift detection determining unit 202 may be for example connected by a NAND connection, and output a signal (0) when detecting a false lock state.

A clock generation process performed by the PLL circuit 24 described with reference to FIG. 5 will next be described with reference to a flowchart of FIG. 15.

In step S1, the reference clock signal input part 53 receives a supply of a reference clock, and then supplies the reference clock to the phase frequency comparator 64 and the frequency lock detecting unit 65.

In step S2, the data signal input part 51 receives an input of a data signal, and then supplies the data signal to the phase comparator 61, the phase lock detecting unit 62, and the false lock detecting unit 63.

In step S3, the switching circuit 67 supplies an output of the phase frequency comparator 64 to the charge pump circuit 68.

Then, the charge pump circuit 68 controls an amount of charge stored in the loop filter 69. The loop filter 69 removes high-frequency noise from the signal supplied thereto, and thus converts an output of the charge pump circuit 68 into a control voltage for controlling the voltage-controlled oscillator 66. The voltage-controlled oscillator 66 controls an oscillation frequency on the basis of the control voltage supplied from the loop filter 69. The M frequency divider 71 divides an output of the voltage-controlled oscillator 66 by the frequency dividing ratio M based on control of the frequency dividing ratio control unit 72, and then outputs the output of the voltage-controlled oscillator 66 after the frequency division by M to the phase frequency comparator 64.

In step S4, the phase frequency comparator 64 compares the reference clock input from the reference clock signal input part 53 with the output of the voltage-controlled oscillator 66 after the frequency division by M, and adjusts the frequency of the voltage-controlled oscillator 66 to the reference clock×M.

In step S5, the frequency lock detecting unit 65 determines whether the frequency at which the voltage-controlled oscillator 66 oscillates is locked to the reference clock×M. When the frequency lock detecting unit 65 determines in step S5 that the frequency at which the voltage-controlled oscillator 66 oscillates is not locked to the reference clock× M, the process proceeds to step S13 to be described later.

When the frequency lock detecting unit 65 determines in step S5 that the frequency at which the voltage-controlled oscillator 66 oscillates is locked to the reference clock×M, in step S6, the frequency lock detecting unit 65 supplies a signal indicating that the frequency is correctly locked to the frequency dividing ratio control unit 72 and the switching circuit 67, and hence the switching circuit 67 supplies an output of the phase comparator 61 to the charge pump circuit 68.

In step S7, the phase comparator 61 compares the data signal input from the data signal input part 51 with the output of the voltage-controlled oscillator 66 after frequency division by N, and adjusts the frequency of the voltage-controlled oscillator 66 to the data rate of the data signal×N.

In step S8, the phase lock detecting unit 62 performs a phase lock detection process to determine whether the phase of the voltage-controlled oscillator 66 is correctly locked to the phase of the data signal input from the data signal input part 51.

In step S9, the phase lock detecting unit 62 determines whether the phase is correctly locked. When the phase lock detecting unit 62 determines in step S9 that the phase is not correctly locked, the process proceeds to step S13 to be described later.

When the phase lock detecting unit 62 determines in step S9 that the phase is correctly locked, the false lock detecting unit 63 performs a false lock detection process to be described later with reference to a flowchart of FIG. 16 in step S10.

In step S11, since the false lock detecting unit 63 outputs a result of the false lock detection process in step S10 to the frequency dividing ratio control unit 72, the frequency dividing ratio control unit 72 determines whether a false lock has occurred. When the frequency dividing ratio control unit 72 determines in step S11 that a false lock has occurred, the process proceeds to step S13 to be described later.

When the frequency dividing ratio control unit 72 determines in step S11 that no false lock has occurred, the frequency dividing ratio control unit 72 in step S12 maintains the current frequency dividing ratios of the N frequency divider 70 and the M frequency divider 71. The process then returns to step S1 to repeat the process from step S1 on down.

When the frequency lock detecting unit 65 determines in step S5 that the frequency at which the voltage-controlled oscillator 66 oscillates is not locked to the reference clock× M, when the phase lock detecting unit 62 determines in step S9 that the phase is not correctly locked, or when the frequency dividing ratio control unit 72 determines in step S11 that a false lock has occurred, the frequency dividing ratio control unit 72 in step S13 changes the current frequency dividing ratios of the N frequency divider 70 and the M frequency divider 71. The process then returns to step S1 to repeat the process from step S1 on down.

By such a process, the PLL circuit 24 can generate the clock signal correctly locked to the supplied data signal from the data signal and the reference clock.

Figure 15:
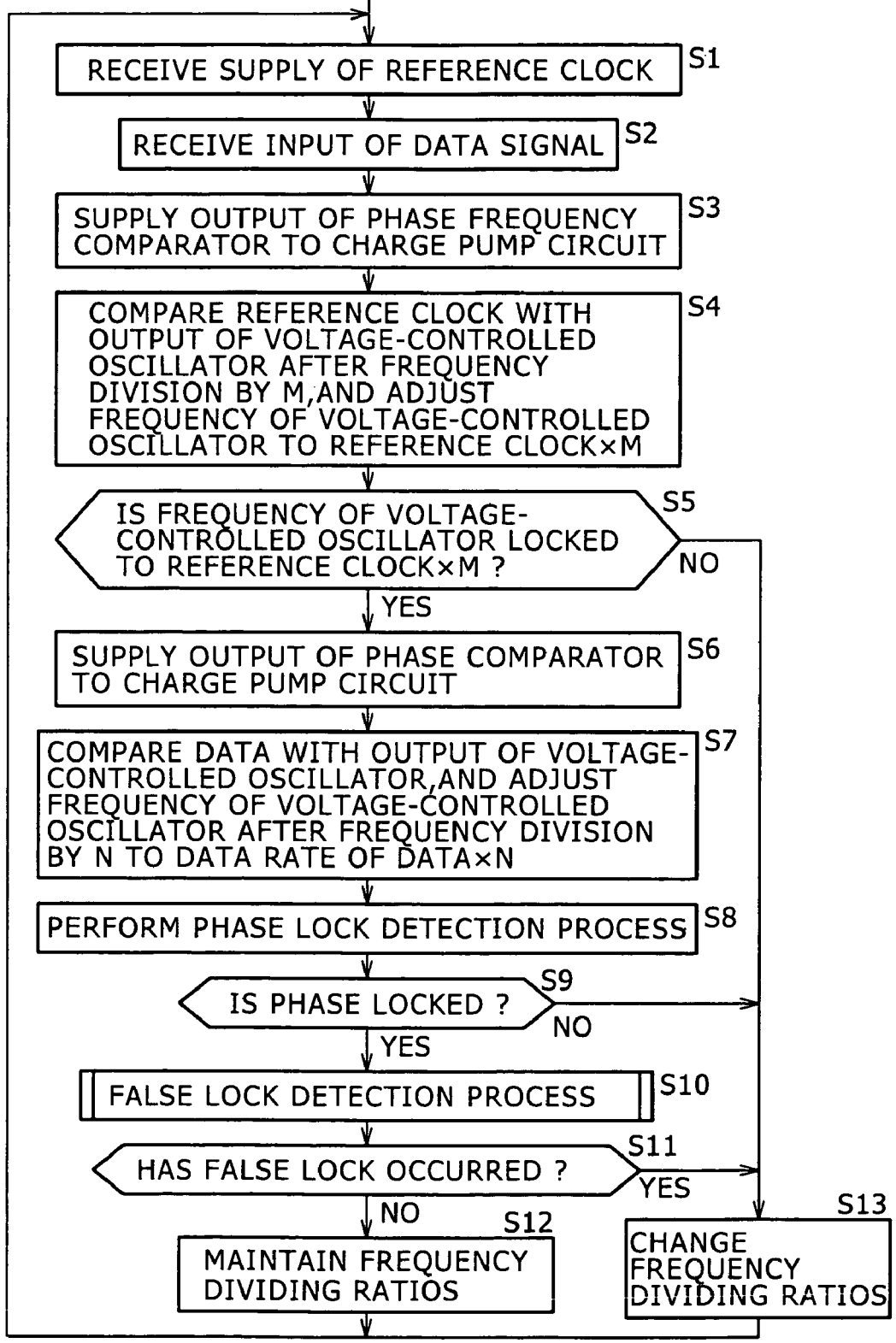
FIG. 15 is a flowchart of assistance in explaining a clock generation process of the PLL circuit.

It is to be noted that while in the flowchart of FIG. 15, the processes of steps S1 to S13 are described as processes that are sequentially performed, these processes are not necessarily performed in time series in the order described in FIG. 15. That is, these processes do not necessarily need to be performed in time series, and include processes that are performed in parallel.

Specifically, the processes of step S10 and step S11 and the processes of step S8 and step S9 are performed in parallel. Further, the frequency dividing ratio control unit 72 changes the current frequency dividing ratios of the N frequency divider 70 and the M frequency divider 71 when receiving an input of a signal indicating incorrect locking from at least one of the frequency lock detecting unit 65, the phase lock detecting unit 62, and the false lock detecting unit 63.

Next, referring to a flowchart of FIG. 16, description will be made of a false lock detection process performed by the false lock detecting unit 63 described with reference to FIG. 6 in step S10 in the clock generation process of the PLL circuit which process is described with reference to FIG. 15.

In step S31, the false lock detecting unit 63 determines whether false lock detection operation is enabled on the basis of a detection enable signal input from the detection enable signal input part 94. When the false lock detecting unit 63 determines in step S31 that the false lock detection operation is not enabled, the process of step S31 is repeated until the false lock detecting unit 63 determines that the false lock detection operation is enabled.

When the false lock detecting unit 63 determines in step S31 that the false lock detection operation is enabled, the pattern detecting unit 101 in step S32 for example captures the data signal input from the data signal input part 121 at rising edges of the clock signal input from the clock signal input part 92, and thereby detects whether there is a pattern (0, 1, 0) or (1, 0, 1) at three consecutive bits in the captured data signal. The pattern detecting unit 101 supplies a result of the detection from the output part 123 to the determining unit 103.

In step S33, the period shift detecting unit 102 for example captures the clock signal input from the clock signal input part 161 and delayed by a predetermined time at rising edges of the data signal input from the data signal input part 162, and thereby detects whether there is a phase period shift. The period shift detecting unit 102 supplies a result of the detection to the determining unit 103.

In step S34, the pattern detection determining unit 201 in the determining unit 103 receives the output signal of the pattern detecting unit 101 which signal is input from the pattern detection input part 191, calculates a value corresponding to a probability of occurrence (frequency of occurrence) of a pattern (0, 1, 0) or (1, 0, 1) by for example integrating input pulses with a resistance and a capacitor or counting input pulses, and determines whether the calculated value is a predetermined threshold value or lower. When the pattern detection determining unit 201 determines in step S34 that the calculated value is the predetermined threshold value or lower, that is, when the pattern detection determining unit 201 determines that the lock state is a false lock state in which m=1 where the ratio of the data rate to the clock frequency is m:n, the process proceeds to step S37 to be described later.

When the pattern detection determining unit 201 determines in step S34 that the calculated value is not the predetermined threshold value or lower, the period shift detection determining unit 202 in the determining unit 103 in step S35 determines whether a period shift has occurred by for example counting input pulses (counting the number of times that the level of the input signal is inverted). When the period shift detection determining unit 202 determines in step S35 that a period shift has occurred, the process proceeds to step S37 to be described later.

When the period shift detection determining unit 202 determines in step S35 that no period shift has occurred, the AND 203 is supplied with a signal (1) from the pattern detection determining unit 201 and the period shift detection determining unit 202 in the example of FIG. 14. Hence, in step S36, the determination signal output part 193 outputs a signal indicating that no false lock has occurred. Then the process proceeds to step S11 in FIG. 15.

When the pattern detection determining unit 201 determines in step S34 that the calculated value is the predetermined threshold value or lower, or when the period shift detection determining unit 202 determines in step S35 that a period shift has occurred, the AND 203 is supplied with a signal (0) from at least one of the pattern detection determining unit 201 and the period shift detection determining unit 202 in the example of FIG. 14. Hence, in step S37, the determination signal output part 193 outputs a signal indicating that a false lock has occurred. Then the process proceeds to step S11 in FIG. 15.

By such a process, the false lock detecting unit 63 can detect occurrence of a false lock regardless of whether m=1 or whether m.1 where the ratio of the data rate to the clock frequency is m:n. Hence, the PLL circuit 24 provided with the false lock detecting unit 63 can detect occurrence of a false lock and recover the clock regardless of whether m=1 or whether m.1 where the ratio of the data rate to the clock frequency is m:n.

Figure 16:
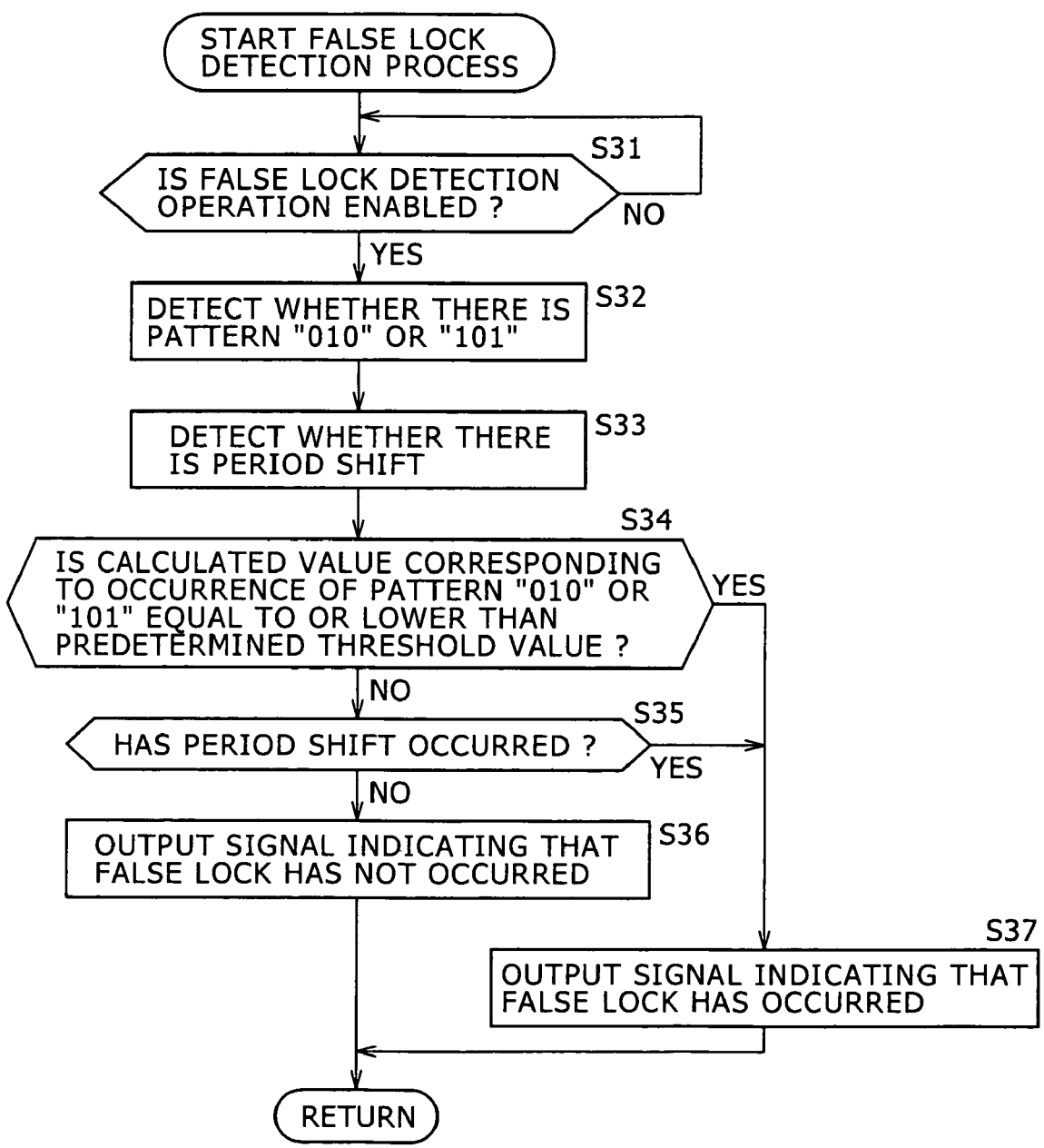
FIG. 16 is a flowchart of assistance in explaining a false lock detection process.

It is to be noted that while in the flowchart of FIG. 16, the processes of steps S31 to S37 are described as processes that are sequentially performed, these processes are not necessarily performed in time series in the order described in FIG. 16. That is, these processes do not necessarily need to be performed in time series, and include processes that are performed in parallel.

Specifically, the processes of step S32 and step S34 and the processes of step S33 and step S35 are performed in parallel.

A PLL circuit similar to the PLL circuit 24 described with reference to FIG. 5 can be used in an optical disk reproducing device 231 shown in FIG. 17, for example, in addition to the optical transmission and reception device 1 described with reference to FIG. 4.

A recording medium 251 is a so-called optical disk. A detector 252 detects a reproduced signal from the recording medium 251, and then supplies the detected signal to a binarizing circuit 253. The binarizing circuit 253 binarizes the detected signal detected by the detector 252, thereby obtains the binarized reproduced signal, and then supplies the binarized reproduced signal to a sector mark detector 254, a synchronizing signal detecting circuit 257, and a PLL circuit 256. The sector mark detector 254 detects a sector mark from the binarized reproduced signal, and then outputs the sector mark to a read gate generating circuit 255. The read gate generating circuit 255 generates a read gate signal on the basis of a result of the detection of the sector mark, and then supplies the read gate signal to the synchronizing signal detecting circuit 257 and the PLL circuit 256.

The PLL circuit 256 generates a clock from the read gate signal and the binarized reproduced signal, and then supplies the clock to the synchronizing signal detecting circuit 257 and a decoder 258. The synchronizing signal detecting circuit 257 generates a synchronizing signal from the read gate signal and the binarized reproduced signal, and then supplies the synchronizing signal to the decoder 258. The decoder 258 decodes the binarized reproduced signal on the basis of the clock signal generated by the PLL circuit 256 and the synchronizing signal generated by the synchronizing signal detecting circuit 257, and supplies the decoded signal to an error correction circuit 260 and an address recognizing circuit 259. The address recognizing circuit 259 recognizes an address from the decoded data. The error correction circuit 260 subjects the decoded data to error correction, and outputs the error-corrected decoded data as reproduced data.

When the PLL 256 in FIG. 17 is of basically the same configuration as the PLL circuit 24 described with reference to FIG. 5, and the false lock detecting unit 63 described with reference to FIG. 6 is provided within the PLL 256, the PLL 256 in the optical disk reproducing device 231 can also detect occurrence of a false lock and recover the clock regardless of whether m=1 or whether m.1 where the ratio of the data rate to the clock frequency is m:n. It is therefore possible to increase accuracy of signal detection.

While the foregoing embodiments have been described assuming that the input data signal is random data, the input data signal for detecting a false lock does not necessarily need to be random data. For example, the present invention can be applied to a data signal having a special pattern embedded therein, such for example as a pattern in which 0 and 1 continue to alternate with each other for a certain period in a manner of 0101 . . . for faster pull-in of the PLL circuit, by for example changing a threshold value used in detection.

As described above, the false lock detecting circuit 63 to which the present invention is applied can recognize a false lock state by using both pattern detection and period shift detection regardless of whether m=1 where the ratio of the data rate to the clock frequency is m:n in a false lock state.

In addition, the PLL circuit 24 or the PLL circuit 256 provided with the false lock detecting unit 63, which circuit is a clock data recovery circuit to which the present invention is applied, can recognize a false lock state and return to a normal lock state even when going into the false lock state.

It should be understood by those skilled in the art that various modifications, combinations, sub-combinations and alterations may occur depending on design requirements and other factors insofar as they are within the scope of the appended claims or the equivalents thereof.

What is claimed is:

1. A false lock detection circuit comprising:
    data signal input means for receiving an input of a data signal;
    clock signal input means for receiving an input of a clock signal generated from said data signal;
    pattern detecting means for obtaining said data signal on a basis of said clock signal, and detecting a data pattern in which adjacent pieces of data at at least three consecutive bits differ from each other;
    phase period shift detecting means for detecting a shift between periods of phases at a change point of said data signal and a change point of said clock signal; and
    determining means for determining whether a false lock has occurred on a basis of results of detection of said pattern detecting means and said phase period shift detecting means.

2. A false lock detection circuit as claimed in claim 1, wherein said false lock detection circuit determines whether to perform an operation of detecting said false lock on a basis of a signal for controlling enabling and disabling of the operation of detecting said false lock.

3. A false lock detection circuit as claimed in claim 1, wherein said phase period shift detecting means obtains said clock signal at one of a rising edge and a falling edge of said data signal, and detects the shift between the periods of the phases at the change point of said data signal and the change point of said clock signal on a basis of a state of the obtained said clock signal.

4. A false lock detection circuit as claimed in claim 3, wherein said phase period shift detecting means delays said clock signal by a predetermined time, and then obtains the delayed said clock signal at one of a rising edge and a falling edge of said data signal.

5. A false lock detection circuit as claimed in claim 3, wherein said phase period shift detecting means counts a number of times that level of said clock signal obtained at one of a rising edge and a falling edge of said data signal is inverted, and detects the shift between the periods of the phases at the change point of said data signal and the change point of said clock signal by comparing a result of counting with a predetermined threshold value.

6. A false lock detection circuit as claimed in claim 1, wherein said pattern detecting means obtains a probability of occurrence of said data pattern; and
    said determining means determines that said false lock has occurred in at least one of cases where the probability of occurrence of said data pattern, said probability being obtained by said pattern detecting means, is a predetermined threshold value or lower and where said phase period shift detecting means detects the shift between the periods of said phases.

7. A false lock detection method for a false lock detection circuit for receiving inputs of a data signal and a clock signal generated from said data signal, and detecting a false lock, said false lock detection method comprising:
    a pattern detecting step of obtaining said data signal on a basis of said clock signal, and detecting a data pattern in which adjacent pieces of data at at least three consecutive bits differ from each other;
    a phase period shift detecting step of detecting a shift between periods of phases at a change point of said data signal and a change point of said clock signal; and an output step of outputting a signal indicating whether said false lock has occurred on a basis of a result of detection of said data pattern by a process of said pattern detecting step and a result of detection of the shift between the periods of said phases by a process of said phase period shift detecting step.

8. A PLL circuit that compares an output signal from an oscillator with a supplied data signal to detect a difference in frequency and phase, and supplies a feedback to said oscillator to generate a clock signal, said PLL circuit comprising:
first determining means for determining whether frequency of the generated said clock signal is locked to a predetermined frequency based on a reference clock;
second determining means for determining whether a phase of the generated said clock signal is correctly locked;
third determining means for determining whether the generated said clock signal is in a false lock state with respect to said data signal; and
control means for controlling a frequency dividing ratio of said output signal from said oscillator on a basis of results of determination of said first determining means, said second determining means, and said third determining means;
wherein said third determining means includes
data signal input means for receiving an input of said data signal,
clock signal input means for receiving an input of said clock signal generated from said data signal,
pattern detecting means for obtaining said data signal on a basis of said clock signal, and detecting a data pattern in which adjacent pieces of data at at least three consecutive bits differ from each other,
phase period shift detecting means for detecting a shift between periods of phases at a change point of said data signal and a change point of said clock signal, and
determining means for determining whether a false lock has occurred on a basis of results of detection of said pattern detecting means and said phase period shift detecting means.

9. A clock data recovery method for a PLL circuit that compares an output signal from an oscillator with a supplied data signal to detect a difference in frequency and phase, and supplies a feedback to said oscillator to generate a clock signal, said clock data recovery method comprising:
a first determining step of determining whether frequency of the generated said clock signal is locked to a predetermined frequency based on a reference clock;
a second determining step of determining whether the generated said clock signal is in a state of a false lock with respect to said data signal;
a third determining step of determining whether a phase of the generated said clock signal is correctly locked; and
a control step of controlling a frequency dividing ratio of said output signal from said oscillator on a basis of results of determination by processes of said first determining step, said second determining step, and said third determining step;
wherein the process of said second determining step includes
a pattern detecting step of obtaining said data signal on a basis of said clock signal, and detecting a data pattern in which adjacent pieces of data at at least three consecutive bits differ from each other,
a phase period shift detecting step of detecting a shift between periods of phases at a change point of said data signal and a change point of said clock signal, and
an output step of outputting a signal indicating whether said false lock has occurred on a basis of a result of detection of said data pattern by a process of said pattern detecting step and a result of detection of the shift between the periods of said phases by a process of said phase period shift detecting step.

10. A communication device receiving a data signal, said communication device comprising:
receiving means for receiving said data signal; and
clock signal generating means for generating a clock signal from said data signal received by said receiving means, using principles of a PLL;
wherein said clock signal generating means includes
first determining means for determining whether frequency of the generated said clock signal is locked to a predetermined frequency based on a reference clock,
second determining means for determining whether a phase of the generated said clock signal is correctly locked,
third determining means for determining whether the generated said clock signal is in a false lock state with respect to said data signal, and
control means for controlling a frequency dividing ratio of an output signal from an oscillator on a basis of results of determination of said first determining means, said second determining means, and said third determining means, and
said third determining means includes
data signal input means for receiving an input of said data signal,
clock signal input means for receiving an input of said clock signal generated from said data signal,
pattern detecting means for obtaining said data signal on a basis of said clock signal, and detecting a data pattern in which adjacent pieces of data at at least three consecutive bits differ from each other,
phase period shift detecting means for detecting a shift between periods of phases at a change point of said data signal and a change point of said clock signal, and
determining means for determining whether a false lock has occurred on a basis of results of detection of said pattern detecting means and said phase period shift detecting means.

11. A communication method for a communication device that receives a data signal, compares an output signal from an oscillator with the received said data signal to detect a difference in frequency and phase, and supplies a feedback to said oscillator to generate a clock signal, said communication method comprising:
a first determining step of determining whether frequency of the generated said clock signal is locked to a predetermined frequency based on a reference clock;
a second determining step of determining whether the generated said clock signal is in a state of a false lock with respect to said data signal;
a third determining step of determining whether a phase of the generated said clock signal is correctly locked; and
a control step of controlling a frequency dividing ratio of said output signal from said oscillator on a basis of results of determination by processes of said first determining step, said second determining step, and said third determining step;

wherein the process of said second determining step includes a pattern detecting step of obtaining said data signal on a basis of said clock signal, and detecting a data pattern in which adjacent pieces of data at at least three consecutive bits differ from each other, a phase period shift detecting step of detecting a shift between periods of phases at a change point of said data signal and a change point of said clock signal, and an output step of outputting a signal indicating whether said false lock has occurred on a basis of a result of detection of said data pattern by a process of said pattern detecting step and a result of detection of the shift between the periods of said phases by a process of said phase period shift detecting step.

12. An optical disk reproducing device for reproducing a data signal recorded on an optical disk, said optical disk reproducing device comprising:

detecting means for detecting said data signal recorded on said optical disk; and clock signal generating means for generating a clock signal from said data signal detected by said detecting means, using principles of a PLL;

wherein said clock signal generating means includes first determining means for determining whether frequency of the generated said clock signal is locked to a predetermined frequency based on a reference clock, second determining means for determining whether a phase of the generated said clock signal is correctly locked, third determining means for determining whether the generated said clock signal is in a false lock state with respect to said data signal, and control means for controlling a frequency dividing ratio of an output signal from an oscillator on a basis of results of determination of said first determining means, said second determining means, and said third determining means, and said third determining means includes data signal input means for receiving an input of said data signal, clock signal input means for receiving an input of said clock signal generated from said data signal, pattern detecting means for obtaining said data signal on a basis of said clock signal, and detecting a data pattern in which adjacent pieces of data at at least three consecutive bits differ from each other, phase period shift detecting means for detecting a shift between periods of phases at a change point of said data signal and a change point of said clock signal, and determining means for determining whether a false lock has occurred on a basis of results of detection of said pattern detecting means and said phase period shift detecting means.

13. An optical disk reproducing method for an optical disk reproducing device that detects a data signal recorded on an optical disk, compares an output signal from an oscillator with the detected said data signal to detect a difference in frequency and phase, and supplies a feedback to said oscillator to generate a clock signal, said optical disk reproducing method comprising:

a first determining step of determining whether frequency of the generated said clock signal is locked to a predetermined frequency based on a reference clock;

a second determining step of determining whether the generated said clock signal is in a state of a false lock with respect to said data signal;

a third determining step of determining whether a phase of the generated said clock signal is correctly locked; and a control step of controlling a frequency dividing ratio of said output signal from said oscillator on a basis of results of determination by processes of said first determining step, said second determining step, and said third determining step;

wherein the process of said second determining step includes a pattern detecting step of obtaining said data signal on a basis of said clock signal, and detecting a data pattern in which adjacent pieces of data at at least three consecutive bits differ from each other, a phase period shift detecting step of detecting a shift between periods of phases at a change point of said data signal and a change point of said clock signal, and an output step of outputting a signal indicating whether said false lock has occurred on a basis of a result of detection of said data pattern by a process of said pattern detecting step and a result of detection of the shift between the periods of said phases by a process of said phase period shift detecting step.

14. A false lock detection circuit comprising:

a data signal input section receiving an input of a data signal;

a clock signal input section receiving an input of a clock signal generated from said data signal;

a pattern detector obtaining said data signal on a basis of said clock signal, and detecting a data pattern in which adjacent pieces of data at at least three consecutive bits differ from each other;

a phase period shift detector detecting a shift between periods of phases at a change point of said data signal and a change point of said clock signal; and a determining section determining whether a false lock has occurred on a basis of results of detection of said pattern detector and said phase period shift detector.

15. A PLL circuit that compares an output signal from an oscillator with a supplied data signal to detect a difference in frequency and phase, and supplies a feedback to said oscillator to generate a clock signal, said PLL circuit comprising:

a first determining section determining whether frequency of the generated said clock signal is locked to a predetermined frequency based on a reference clock;

a second determining section determining whether a phase of the generated said clock signal is correctly locked;

a third determining section determining whether the generated said clock signal is in a false lock state with respect to said data signal; and a controller controlling a frequency dividing ratio of said output signal from said oscillator on a basis of results of determination of said first determining section, said second determining section, and said third determining section;

wherein said third determining section includes a data signal input section receiving an input of said data signal, a clock signal input section receiving an input of said clock signal generated from said data signal, a pattern detector obtaining said data signal on a basis of said clock signal, and detecting a data pattern in which adjacent pieces of data at at least three consecutive bits differ from each other, a phase period shift detector detecting a shift between periods of phases at a change point of said data signal and a change point of said clock signal, and a determining section determining whether a false lock has occurred on a basis of results of detection of said pattern detector and said phase period shift detector.

16. A communication device receiving a data signal, said communication device comprising:

a receiver receiving said data signal; and a clock signal generator generating a clock signal from said data signal received by said receiver, using principles of a PLL;

wherein said clock signal generator includes a first determining section determining whether frequency of the generated said clock signal is locked to a predetermined frequency based on a reference clock, a second determining section determining whether a phase of the generated said clock signal is correctly locked, a third determining section determining whether the generated said clock signal is in a false lock state with respect to said data signal, and a controller controlling a frequency dividing ratio of an output signal from an oscillator on a basis of results of determination of said first determining section, said second determining section, and said third determining section, and said third determining section includes a data signal input section receiving an input of said data signal, a clock signal input section receiving an input of said clock signal generated from said data signal, a pattern detector obtaining said data signal on a basis of said clock signal, and detecting a data pattern in which adjacent pieces of data at at least three consecutive bits differ from each other, a phase period shift detector detecting a shift between periods of phases at a change point of said data signal and a change point of said clock signal, and a determining section determining whether a false lock has occurred on a basis of results of detection of said pattern detector and said phase period shift detector.

17. An optical disk reproducing device for reproducing a data signal recorded on an optical disk, said optical disk reproducing device comprising:

a detector detecting said data signal recorded on said optical disk; and a clock signal generator generating a clock signal from said data signal detected by said detector, using principles of a PLL;

wherein said clock signal generator includes a first determining section determining whether frequency of the generated said clock signal is locked to a predetermined frequency based on a reference clock, a second determining section determining whether a phase of the generated said clock signal is correctly locked, a third determining section determining whether the generated said clock signal is in a false lock state with respect to said data signal, and a controller controlling a frequency dividing ratio of an output signal from an oscillator on a basis of results of determination of said first determining section, said second determining section, and said third determining section, and said third determining section includes a data signal input section receiving an input of said data signal, a clock signal input section receiving an input of said clock signal generated from said data signal, a pattern detector obtaining said data signal on a basis of said clock signal, and detecting a data pattern in which adjacent pieces of data at at least three consecutive bits differ from each other, a phase period shift detector detecting a shift between periods of phases at a change point of said data signal and a change point of said clock signal, and a determining section determining whether a false lock has occurred on a basis of results of detection of said pattern detector and said phase period shift detector.

* * * * *